US008787071B2

(12) United States Patent
Katoh

(10) Patent No.: US 8,787,071 B2
(45) Date of Patent: *Jul. 22, 2014

(54) NONVOLATILE STORAGE DEVICE AND METHOD FOR WRITING INTO THE SAME

(71) Applicant: Panasonic Corporation, Osaka (JP)

(72) Inventor: Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/060,707

(22) Filed: Oct. 23, 2013

(65) Prior Publication Data
US 2014/0050015 A1 Feb. 20, 2014

Related U.S. Application Data

(62) Division of application No. 13/322,603, filed as application No. PCT/JP2011/001810 on Mar. 28, 2011, now Pat. No. 8,593,853.

(30) Foreign Application Priority Data

Mar. 30, 2010 (JP) ................. 2010-079688

(51) Int. Cl.
*G11C 11/00* (2006.01)
*G11C 13/00* (2006.01)
*H01L 45/00* (2006.01)

(52) U.S. Cl.
CPC ............ *G11C 13/0069* (2013.01); *H01L 45/08* (2013.01); *G11C 13/0064* (2013.01); *G11C 2213/79* (2013.01); *H01L 45/146* (2013.01); *H01L 45/1233* (2013.01); *G11C 13/004* (2013.01); *G11C 2213/72* (2013.01)
USPC ....................................... 365/148

(58) Field of Classification Search
CPC ............... G11C 11/14; G11C 11/5685; G11C 13/0002; G11C 13/0069; G11C 2213/79
USPC .......... 365/148, 100, 189.09, 189.14, 189.16, 365/205
See application file for complete search history.

(56) References Cited

U.S. PATENT DOCUMENTS 5,287,317 A 2/1994 Kobayashi et al.
6,317,375 B1 11/2001 Perner
(Continued)

FOREIGN PATENT DOCUMENTS

CN 101636840 1/2010
JP 08-124389 5/1996
(Continued)

OTHER PUBLICATIONS

International Search Report issued May 17, 2011 in International (PCT) Application No. PCT/JP2011/001810.
(Continued)

*Primary Examiner* — Pho M Luu
(74) *Attorney, Agent, or Firm* — Wenderoth, Lind & Ponack, LLP.

(57) ABSTRACT

The nonvolatile storage device includes a variable resistance element and a write circuit which writes data into the variable resistance element, wherein the variable resistance element has a property of changing from a first resistance state to a second resistance state when a pulse of a first voltage is applied to the variable resistance element, and changing from the second resistance state to the first resistance state when a pulse of a second voltage is applied to the variable resistance element, and the write circuit applies, to the variable resistance element, at least the pulse of the first voltage, a pulse of a third voltage, and the pulse of the first voltage in this order, when the variable resistance element is caused to change from the first resistance state to the second resistance state.

13 Claims, 22 Drawing Sheets

(56) References Cited

U.S. PATENT DOCUMENTS

| | | | |
|---|---|---|---|
| 7,760,539 B2* | 7/2010 | Katoh | 365/148 |
| 7,911,824 B2* | 3/2011 | Kawai et al. | 365/148 |
| 7,990,754 B2* | 8/2011 | Azuma et al. | 365/148 |
| 8,094,482 B2* | 1/2012 | Wei et al. | 365/148 |
| 8,102,696 B2* | 1/2012 | Katoh et al. | 365/148 |
| 8,154,909 B2* | 4/2012 | Azuma et al. | 365/148 |
| 8,179,714 B2 | 5/2012 | Takagi et al. | |
| 8,233,311 B2 | 7/2012 | Shimakawa et al. | |
| 8,406,035 B2 | 3/2013 | Katoh et al. | |
| 8,472,238 B2 | 6/2013 | Shimakawa et al. | |
| 8,593,853 B2* | 11/2013 | Katoh | 365/148 |
| 8,625,328 B2* | 1/2014 | Tomotani et al. | 365/148 |
| 2004/0114427 A1 | 6/2004 | Hamaguchi | |
| 2004/0114429 A1 | 6/2004 | Ehiro et al. | |
| 2004/0114444 A1 | 6/2004 | Matsuoka | |
| 2006/0203542 A1 | 9/2006 | Kurotsuchi et al. | |
| 2006/0265548 A1 | 11/2006 | Symanczyk et al. | |
| 2007/0115714 A1 | 5/2007 | Muraoka et al. | |
| 2008/0259678 A1 | 10/2008 | Muraoka et al. | |
| 2009/0224224 A1 | 9/2009 | Fujii et al. | |
| 2010/0103723 A1 | 4/2010 | Kawai et al. | |
| 2010/0226164 A1 | 9/2010 | Nagashima et al. | |

FOREIGN PATENT DOCUMENTS

| | | |
|---|---|---|
| JP | 2002-140888 | 5/2002 |
| JP | 2004-185753 | 7/2004 |
| JP | 2004-185756 | 7/2004 |
| JP | 2004-234707 | 8/2004 |
| JP | 2006-221737 | 8/2006 |
| JP | 2006-331626 | 12/2006 |
| JP | 2007-004935 | 1/2007 |
| JP | 2007-515026 | 6/2007 |
| JP | 2009-099199 | 5/2009 |
| WO | 2005/059921 | 6/2005 |
| WO | 2008/153124 | 12/2008 |
| WO | 2009/016824 | 2/2009 |
| WO | 2009/051274 | 4/2009 |
| WO | 2009/145308 | 12/2009 |

OTHER PUBLICATIONS

Z. Wei et al., "Highly Reliable TaOx ReRAM and Direct Evidence of Redox Reaction Mechanism" IEEE (2008).

An Office Action, issued Aug. 27, 2013 along with a Search Report in a Chinese application that is a foreign counterpart to the present application (with English translation of Search Report).

* cited by examiner

FIG. 1
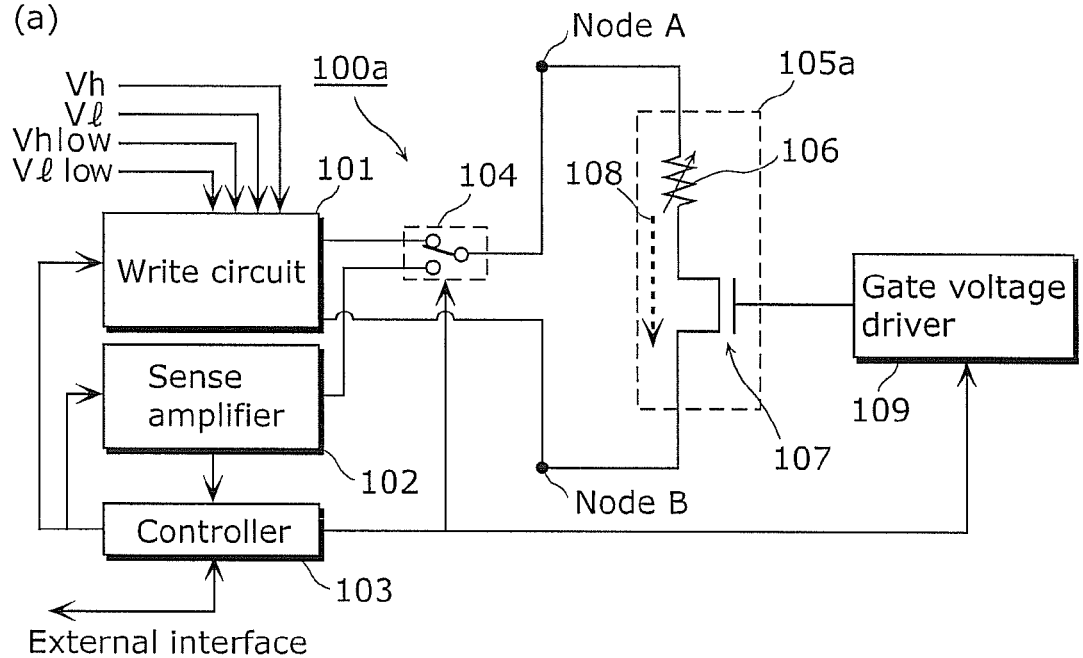
(a)
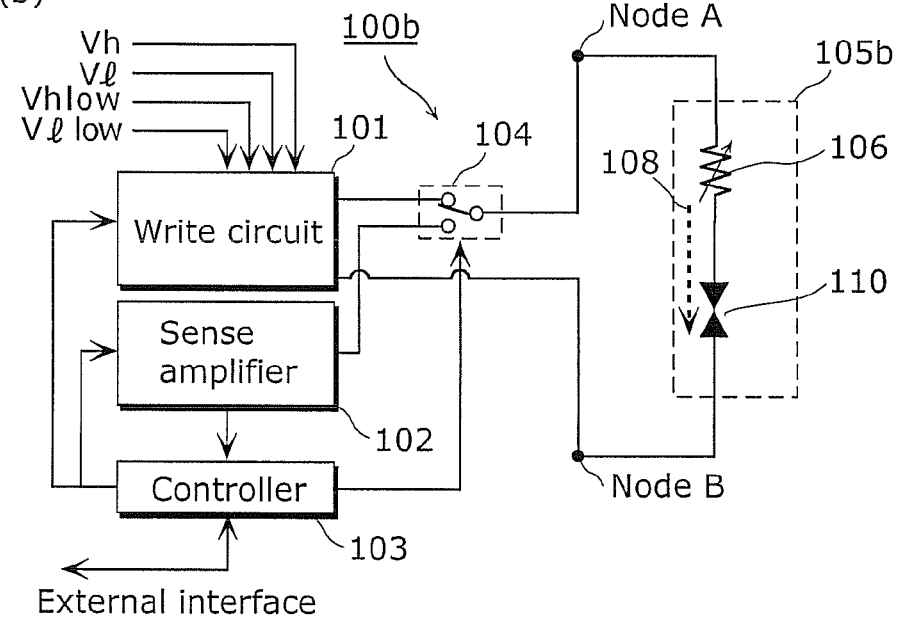
(b)

FIG. 9
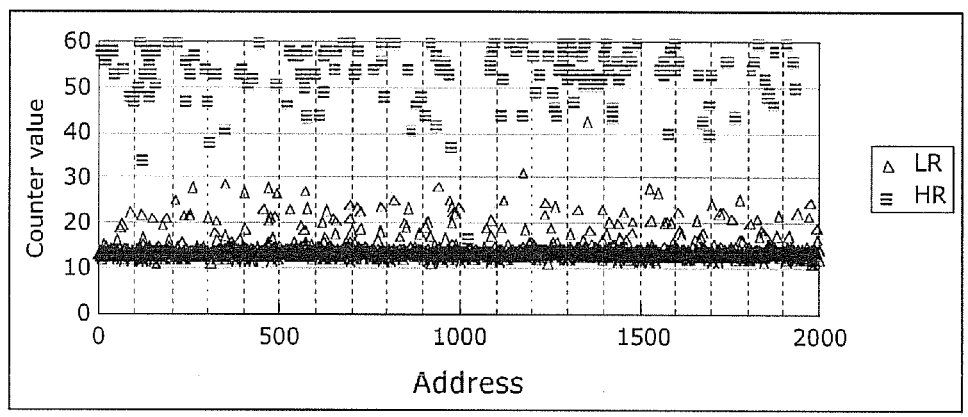
(a)
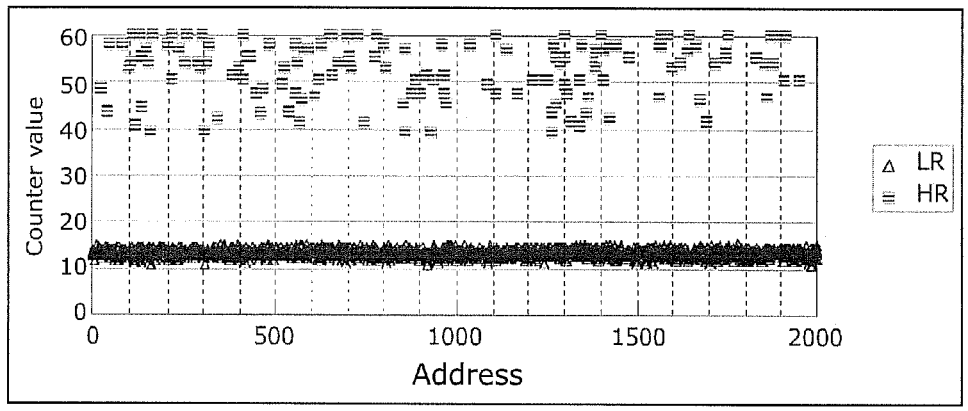
(b)

FIG. 11
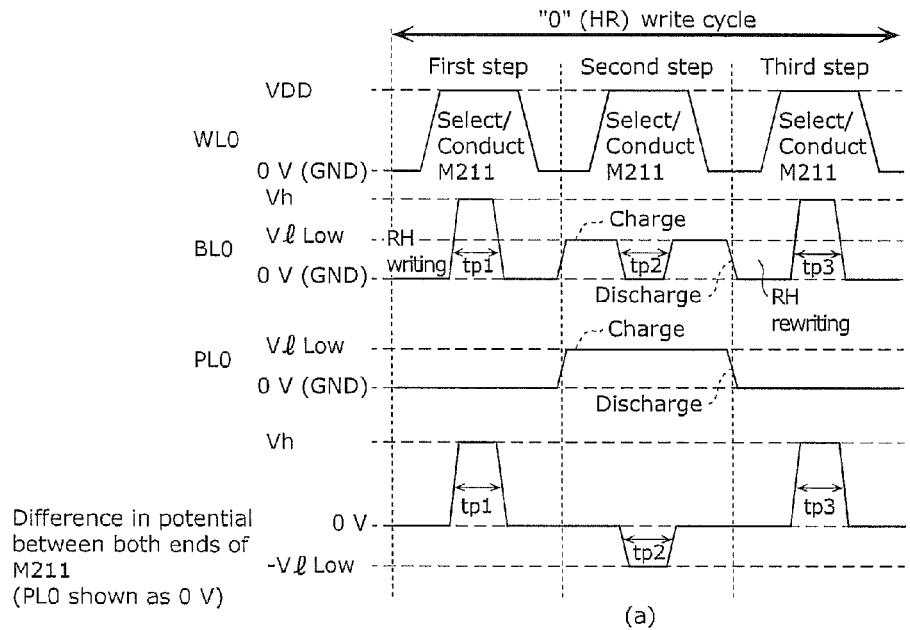
(a)
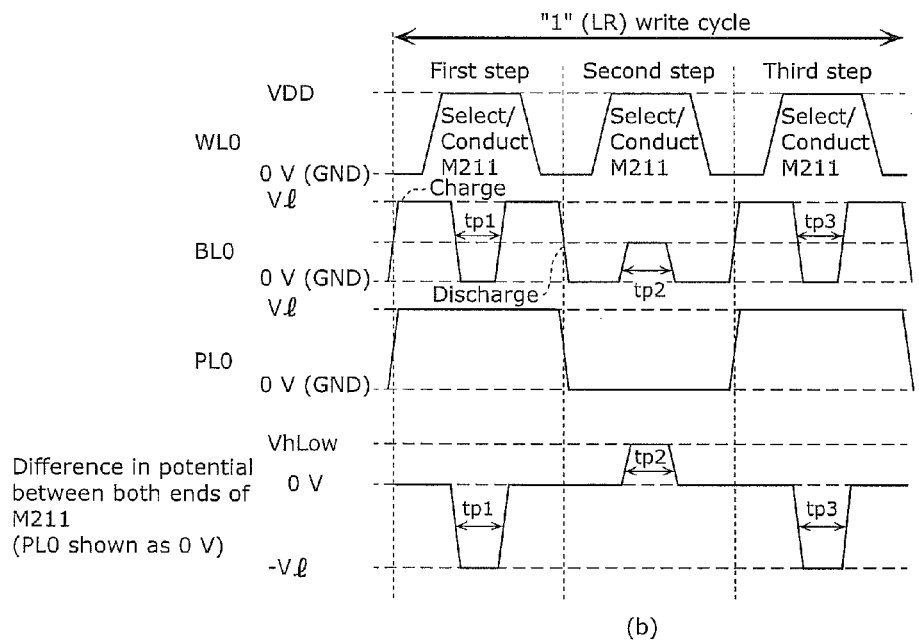
(b)

NONVOLATILE STORAGE DEVICE AND METHOD FOR WRITING INTO THE SAME

This application is a divisional application of application Ser. No. 13/322,603 (now U.S. Pat. No. 8,593,853, issued Nov. 26, 2013), which is the U.S. National Stage of International Application PCT/JP2011/001810, filed Mar. 28, 2011.

TECHNICAL FIELD

The present invention relates to nonvolatile storage devices and methods for writing into the same. More specifically, the present invention relates to a nonvolatile storage device including variable resistance elements and a method for writing into the nonvolatile storage device.

BACKGROUND ART

Nonvolatile storage devices are widely included in mobile apparatuses such as cell phones and digital cameras, and the use of the nonvolatile storage devices is rapidly increasing. In recent years, opportunities for handling audio data and image data have been increasing, a strong demand for the nonvolatile storage devices having a larger capacity and operating faster than ever has started to grow. Moreover, a demand for low power consumption has been further increasing in the field of the nonvolatile storage devices for mobile apparatus.

Current nonvolatile storage devices are mainly flash memories. The flash memories store data by controlling charges accumulated in floating gates. The flash memories have a structure of accumulating, using a high electrical field, the charges in the floating gates, and thus a problem has been pointed out that there is a limit to downsizing of the flash memories and it is difficult to perform flash memory microfabrication necessary for a further increase in capacity. Moreover, the flash memories need to always collectively erase predetermined blocks for rewriting. With such a characteristic, it takes a very long time to rewrite the flash memories, and there is a limit to random access to and an increase in the speed of the flash memories.

Examples of next-generation nonvolatile storage devices solving the above problems include nonvolatile storage devices using variable resistance elements which store data by change in electrical resistance. Examples of nonvolatile semiconductor devices (also referred to as "nonvolatile memories") using currently proposed variable resistance elements include MRAMs (Magnetic RAMs), PCRAMs (Phase-Change RAMs), ReRAMs (Resistive RAMs), and so on (refer to PTL 1 to PTL 3, for instance).

PTL 1 discloses an example of a method for controlling a bipolar ReRAM element using an oxide having a perovskite structure. Here, the term "bipolar" refers to a resistance change of the ReRAM element to a high resistance state caused by a voltage pulse having one of polarities which is applied to the ReRAM element, and a resistance change of the ReRAM element to a low resistance state caused by a voltage pulse having the other of the polarities which is applied to the ReRAM element. The ReRAM element is an element which can reversibly change between at least a first resistance state (also referred to as "low resistance state", "LR state", or simply "LR") and a second resistance state (also referred to as "high resistance state", "HR state", or simply "HR") having a higher resistance value than the first resistance state, and refers to a nonvolatile memory which stores data depending on one of the resistance states.

The following describes the method for controlling a ReRAM element with reference to the drawings.

Each of FIGS. 20 to 22 is a diagram showing a method for controlling a memory cell 9 disclosed in PTL 1. The memory cell 9 includes a variable resistance element 1 and a selection transistor 2. The variable resistance element 1 has one of terminals electrically connected to one of main terminals (drain and source) of the selection transistor 2. The selection transistor 2 has the other of the main terminals (source and drain) electrically connected to a source line terminal 3 via a source line 6. The variable resistance element 1 has the other of the terminals electrically connected to a bit line terminal 5 via a bit line 8. The selection transistor 2 has a gate electrically connected to a word line terminal 4 via a word line 7. In any one of the cases of writing data (writing "1" (here, data "1" assigned to the HR state of the ReRAM element)), erasing data (writing "0" (here, data "0" assigned to the LR state of the ReRAM element)), and reading data, applying a high-level turn-on voltage to the word line terminal 4 of a selected memory cell conducts the selection transistor 2.

FIG. 20 is a diagram showing an application state of a voltage pulse at the time of performing a write operation in the memory cell 9 in PTL 1. The source line 6 is set to 0 V (grounded), a positive write pulse having a predetermined write voltage is applied to the bit line 8, and desired data is written into the variable resistance element 1. When multi-valued data is written into the variable resistance element 1, the voltage of the write pulse is set to a level corresponding to the value of the data to be written. For example, when four-valued data is written into the variable resistance element 1, one of four voltages predetermined according to each of the values of the data to be written is selected, and the write operation is performed. Moreover, an appropriate write pulse width is selected according to the element. In other words, a resistance change of the memory cell 9 to a predetermined resistance state requires a voltage level or a pulse width corresponding to the resistance state.

FIG. 21 is a diagram showing an application state of a voltage pulse at the time of performing an erase operation in the memory cell 9 in PTL 1. The bit line 8 is set to 0 V (grounded), and a positive erase pulse having a predetermined erase voltage is applied to the source line 6. The application of the erase pulse causes an electrical resistance of the variable resistance element 1 to be a minimum value. PTL 1 discloses applying an erase pulse to a specific source line 6 in a state where bit lines 8 are set to 0 V erases collectively and simultaneously memory cells connected to the bit lines 8 and the source line 6.

FIG. 22 is a diagram showing an application state of a voltage pulse at the time of performing a read operation in the memory cell 9 in PTL 1. When data stored in the variable resistance element 1 is read, the source line 6 is set to 0 V (grounded), and a predetermined read voltage is applied to a selected bit line 8 via a read circuit. Upon the application of the read voltage, a comparison and determination circuit compares a level of the bit line 8 with a reference level for reading, and the stored data is read.

PTL 2 and PTL 3 suggest a verify operation for verifying whether or not an electrical condition in which writing is performed to increase the reliability of data to be written satisfies a desired threshold value in a general semiconductor memory or ReRAM/variable resistance memory which allows electrical erasing and writing. To put it differently, in the case of data writing, as shown in FIG. 23, after a program command (e.g. "write") is inputted (S51), application of a program pulse to a selected memory cell is started by inputting and latching addresses and data (S52), and the data is written into the memory cell (S53). After the application of the program pulse is stopped, a program verify mode is activated by inputting a program verify command (S54), and data reading from the memory cell into which the data has been written is started (S55). The data obtained through the data reading is compared with an expectation value data that is initially inputted (S56). When they match each other (YES in S56), the program is successfully ended, and a read mode is activated (S57). In contrast, when they do not match each other (NO in S56), the program pulse is applied again, and additional writing is performed (S51 to S53). This series of operations is repeated until all of data match each other. For practical purposes, however, an upper limit of repetition is often set to avoid an infinite loop. FIG. 24 is a timing diagram showing that a program is ended because expectation value data matches written data the third time a series of operations for a verify operation is performed after a program pulse is applied. Such a verify operation allows a physical characteristic written into a nonvolatile memory to reach a desired level, allows a margin for a threshold value used for determination to restore data to original digital data, and ensures a further increase in data reliability.

CITATION LIST

Patent Literature

[PTL 1]
Japanese Unexamined Patent Application Publication No. 2004-185756
[PTL 2]
U.S. Pat. No. 5,287,317
[PTL 3]
Japanese Unexamined Patent Application Publication No. 2004-234707
[PTL 4]
Japanese Unexamined Patent Application Publication No. 2006-221737

Non Patent Literature

[NPL 1]
"Highly Reliable TaOx ReRAM and Direct Evidence of Redox Reaction Mechanism" IEDM Tech. Dig., p. 293 (2008)

SUMMARY OF INVENTION

Technical Problem

The inventor discovered that a write error occurs when a nonvolatile storage device using a conventional bipolar ReRAM performs a verify operation and accompanying additional writing. Although the discovered write error is described in detail in "Solution to Problem", it is briefly mentioned here that the biggest problem of the phenomenon lies in that insufficient write conditions cause resistance values to vary after the verify operation is performed, and bits below a verify threshold level are generated. Such failed bits are randomly generated in a memory cell array, and the verify operation to be performed immediately after data are written into memory cells does not make it possible to verify whether or not the data are successfully written, and fails to notice the write error. Originally, the verify operation sets aside a predetermined detection margin so that the nonvolatile memories ensure data reliability against a degrading factor such as long storage, high-temperature storage, and a number of rewrite cycles. However, when the write error occurs, the verify operation does not make it possible to ensure a necessary margin, and it is impossible to secure reliability necessary at the time of data reading.

The present invention has been conceived to solve such a problem, and an object of the present invention is to provide a nonvolatile storage device or the like which increases the stability and reliability of write operations.

Solution to Problem

The inventor eagerly considered how to increase the stability and reliability of operations in a nonvolatile storage device using a ReRAM. In the course of the consideration, examined was a function of (i) checking, using the verify operation, a written resistance level after a write operation into the ReRAM, and (ii) performing additional writing when the written resistance level does not satisfy a desired resistance value. However, although the desired resistance value is satisfied at the time of the verify operation performed immediately after the write operation is performed, the resistance value gradually varies over a short time afterward, and a write error occurs in which the resistance value varies to a level at which a verify threshold resistance value cannot be satisfied.

In general, a physical amount written into a memory cell often varies due to deterioration of material composition or the like caused by shelf test or high-temperature storage life test, and additionally repeated write operation. Writing is required so that a physical amount at initial writing satisfies a predetermined condition, based on specifications for reliability necessary for such variation. Stated differently, when data is decoded to original digital data by comparing the written physical amount with a predetermined threshold value, writing is performed so that an appropriate margin (hereafter, also referred to as "detection (or read) margin") is ensured between the written physical amount and the threshold value. The verify operation is performed to ensure such a detection margin. However, when the written physical amount rapidly varies to be close to the threshold value immediately after it is judged by performing the verify operation that a predetermined level is satisfied, it is impossible to ensure the detection margin and to secure the necessary reliability. This is a crucial issue to the nonvolatile memories. The ReRAMs used in the present invention have advantages of (i) excellent high speed such as a capability of writing within a short period of time like a several tens of ns and (ii) excellent reliability such as a capability of holding data for a long period of time even in a high-temperature environment as long as writing has been successful, and have a high potential as next-generation semiconductor memories replacing the conventional semiconductor memories. However, even though bits for which performing the above verify operation does not detect the write error are rare, it is impossible to make the best use of the superior performance of the ReRAMs as the whole device when such bits are generated.

In reaction to such an issue, the inventor has discovered that special writing steps significantly reduce the number of bits for which the write error occurs.

In order to solve the problem, a nonvolatile storage device according to one aspect of the present invention includes: a variable resistance element which includes a first electrode, a second electrode, and a variable resistance layer provided between the first electrode and the second electrode; and a write circuit which writes data into the variable resistance element, wherein the variable resistance element has a property of changing from a first resistance state to a second resistance state when a pulse of a first voltage is applied to the variable resistance element, and changing from the second resistance state to the first resistance state when a pulse of a second voltage having a different polarity from a polarity of the first voltage is applied to the variable resistance element, the first resistance state being a state where first data is stored and the second resistance state being a state where second data is stored, and the write circuit applies, to the variable resistance element, at least the pulse of the first voltage, a pulse of a third voltage, and the pulse of the first voltage in this order, when the variable resistance element is caused to change from the first resistance state to the second resistance state, the third voltage having a smaller absolute value than an absolute value of the second voltage and a same polarity as the polarity of the second voltage.

It is to be noted that the "first resistance state" and the "second resistance state" may correspond to the high resistance state and the low resistance state, respective, and vice versa.

With this configuration, using a writing method reduces the number of bits which approximate a threshold value as the written resistance value varies within a short period of time as above, and significantly reduces the number of occurrences of bits which cause a detection margin to decrease. As a result, it is possible to reduce redundant bits for error correction, and secure the further reliability.

It is to be noted that although PTL 4 discloses a technique similar to the writing method in which the pulse having the polarity opposite to the polarity to be normally written is applied, the present invention differs from PTL 4 not only in the objects and effects of the invention but also in a specific method of determining a voltage and application steps.

Moreover, in the nonvolatile storage device, the third voltage may have a larger pulse width than a pulse width of the first voltage. Conversely, in the nonvolatile storage device, the first voltage may have a larger pulse width than a pulse width of the third voltage.

Alternatively, in the nonvolatile storage device, the write circuit may apply, to said variable resistance element, the pulse of the first voltage at least one time after said write circuit repeats the application of the pulse of the first voltage and the application of the pulse of the third voltage N times, where N is an integer equal to or greater than 2. Here, it is preferred that in the repetition of N times, the write circuit apply the pulse of the third voltage N times so that the absolute value of the third voltage decreases as the number of repetitions increases. With this, the write cycle is repeated effectively, and thus it is possible to reduce failed bits.

Furthermore, the nonvolatile storage device may include: a read circuit which reads data from the variable resistance element; and a control circuit which controls the write circuit and the read circuit, wherein the read circuit performs a read process after the write circuit performs, when the variable resistance element is caused to change from the first resistance state to the second resistance state, at least (i) a first write process of applying the pulse of the first voltage to the variable resistance element and (ii) a second write process of applying the pulse of the third voltage and the pulse of the first voltage to the variable resistance element in this order, and the control circuit controls the write circuit and the read circuit so that the second write process and the read process are repeated until the variable resistance element has a predetermined resistance value. With this, the successful writing is confirmed with verify after writing, and thus it is possible to further reduce the failed bits.

Moreover, after the write circuit first performs the second write process and the read circuit then performs the read process after a lapse of a predetermined time, the control circuit may control the write circuit and the read circuit so that the second write process and the read process are repeated until the variable resistance element has the predetermined resistance value. With this, data writing is surely performed for failed bits having a delay time that changes written values due to a time lapse subsequent to writing.

Furthermore, in the nonvolatile storage device, the variable resistance element and a selection element may constitute a memory cell, the selection element being connected in series to the variable resistance element and switching between a conduction state and a nonconduction sate of the variable resistance element, and the nonvolatile storage device may further include: a memory cell array which is a set of memory cells including the memory cell; a selection circuit which selects at least one of the memory cells from the memory cell array; a read circuit which reads data from the memory cell selected by the selection circuit; a write data buffer which holds data items to be written into M memory cells in the memory cell array, the M memory cells corresponding to the data items, where M is an integer equal to or greater than 2; a read data buffer which holds data items read from M memory cells in the memory cell array; a comparison circuit which compares the data items of the corresponding M memory cells in the write data buffer with the data items of the M memory cells in the read data buffer, and judges whether or not the data items match each other; and a control circuit which performs (i) control of the selection circuit and the write circuit so that the data items held in the write data buffer are written into the corresponding M memory cells in the memory cell array, (ii) control of the selection circuit and the read circuit so that the data items are read from the M memory cells in the memory cell array and held in the read data buffer, and (iii) control as to whether or not to rewrite again the data items held in the write data buffer into the corresponding M memory cells, based on a result of the comparison by the comparison circuit.

With this configuration, the writing, verify, and additional writing are collectively performed in a unit of a capacity of the write data buffer, and thus the data writing is surely performed for the failed bits which, although the failed bits would be considered normal immediately after the writing when the writing, verify, and additional writing were performed in a unit of 1 bit, have the delay time that changes the written values due to the subsequent elapsed time.

Here, each of the write data buffer and the read data buffer may include a plurality of data buffer areas, the data buffer areas of the write data buffer corresponding to the data buffer areas of the read data buffer, and the control circuit may sequentially perform, for the data buffer areas of the write data buffer and the data buffer areas of the read data buffer, (i) the control of the selection circuit and the write circuit so that the data items held in the write data buffer are written into the corresponding M memory cells in the memory cell array, (ii) the control of the selection circuit and the read circuit so that the data items are read from the M memory cells in the memory cell array and held in the read data buffer, and (iii) the control as to whether or not to rewrite again the data items held in the write data buffer into the corresponding M memory cells, based on a result of the comparison by the comparison circuit.

Moreover, in order to solve the problem, a method for writing data which is performed by a nonvolatile storage device including a variable resistance element according to another aspect of the present invention, the variable resistance element has a property of changing from a first resistance state to a second resistance state when a pulse of a first voltage is applied to the variable resistance element, and changing from the second resistance state to the first resistance state when a pulse of a second voltage having a different polarity from a polarity of the first voltage is applied to the variable resistance element, the first resistance state being a state where first data is stored and the second resistance state being a state where second data is stored, the method for writing may include: applying, to the variable resistance element, at least the pulse of the first voltage when the variable resistance element is caused to change from the first resistance state to the second resistance state; subsequently applying, to the variable resistance element, a pulse of a third voltage having a smaller absolute value than an absolute value of the second voltage and a same polarity as the polarity of the second voltage; and further subsequently applying the pulse of the first voltage to the variable resistance element.

With this configuration, using the writing method reduces the number of bits which approximate the threshold value as the written resistance value varies within a short period of time as above, and significantly reduces the number of occurrences of bits which cause the detection margin to decrease. As a result, it is possible to reduce the redundant bits for error correction, and secure the further reliability.

The method for writing may further include reading a resistance state of the variable resistance element using a pulse of a voltage which has a smaller voltage magnitude than the pulse of the first voltage or the second voltage and application of which does not cause the resistance state of the variable resistance element to change, the reading being subsequent to the applying, the subsequently applying, and the further subsequently applying, wherein it is preferred that the subsequently applying, the further subsequently applying, and the reading be repeated until the resistance state of the variable resistance element changes to a predetermined resistance state. With this, the successful writing is confirmed with verify after writing, and thus it is possible to further reduce the failed bits.

Advantageous Effects of Invention

The nonvolatile storage device and the method for writing into the same according to an implementation of the present invention perform writing so that performing the verify operation according to the conventional technique ensures the appropriate margin between the written resistance value and the predetermined threshold value, when the data is decoded to the original digital data by comparing the written resistance value with the threshold value, and thus make it possible to secure the desired reliability and significantly reduce the following defect the inventor has discovered.

The defect is that when the written resistance value rapidly varies to be close to the threshold value immediately after it is judged by performing the verify operation that a predetermined level is satisfied, it is impossible to ensure the detection margin and to secure the necessary reliability. Thus, the present invention provides the nonvolatile semiconductor device which significantly reduces such failed bits and redundant bits for error correction, and increases the reliability further.

BRIEF DESCRIPTION OF DRAWINGS

[FIG. 1]
(a) in FIG. 1 is a block diagram showing an exemplary basic configuration of a nonvolatile storage device according to Embodiment 1 of the present invention which includes a memory cell including a three-terminal selection element, and (b) in FIG. 1 is a block diagram showing an exemplary basic configuration of a nonvolatile storage device according to Embodiment 1 of the present invention which includes a memory cell including a two-terminal selection element.

FIG. 2 is an element configuration diagram showing an exemplary configuration of a variable resistance element in the nonvolatile storage device according to Embodiment 1 of the present invention.

FIG. 3 is a graph showing a specific example of a voltage-resistance change characteristic of the variable resistance element in the nonvolatile storage device according to Embodiment 1 of the present invention.

FIG. 4 is a block diagram showing a specific example of a sense amplifier in the nonvolatile storage device according to Embodiment 1 of the present invention.

FIG. 6 is a block diagram showing a specific example at the time of forming a specific memory cell array structure in the nonvolatile storage device according to Embodiment 1 of the present invention.

FIG. 7 is a conceptual diagram illustrating a normal write operation and read operation at the time of forming the memory cell array structure in FIG. 6 in the nonvolatile storage device according to Embodiment 1 of the present invention.

FIG. 8 is a flowchart illustrating an example at the time of performing a verify operation in the nonvolatile storage device according to Embodiment 1 of the present invention.

[FIG. 9]
(a) in FIG. 9 is a graph showing a variation in resistance values when the verify operation is not performed in the nonvolatile storage device according to Embodiment 1 of the present invention, and (b) in FIG. 9 is a graph showing a variation in resistance values when the verify operation is performed in the nonvolatile storage device according to Embodiment 1 of the present invention.

FIG. 10 is a graph illustrating a newly discovered issue in the verify operation.

[FIG. 11]
Each of (a) and (b) in FIG. 11 is a timing diagram illustrating the most basic write pattern (HR writing or LR writing) for solving the issue, in the nonvolatile storage device according to Embodiment 1 of the present invention.

FIG. 12 is a graph illustrating effects of writing methods performed, in the nonvolatile storage device according to Embodiment 1 of the present invention, to solve the issue.

FIG. 14 is a graph illustrating effects of the modifications of the writing methods in the nonvolatile storage device according to Embodiment 1 of the present invention.

FIG. 15 is a graph showing an effect of LR writing in the nonvolatile storage device according to Embodiment 1 of the present invention.

Figure 16:
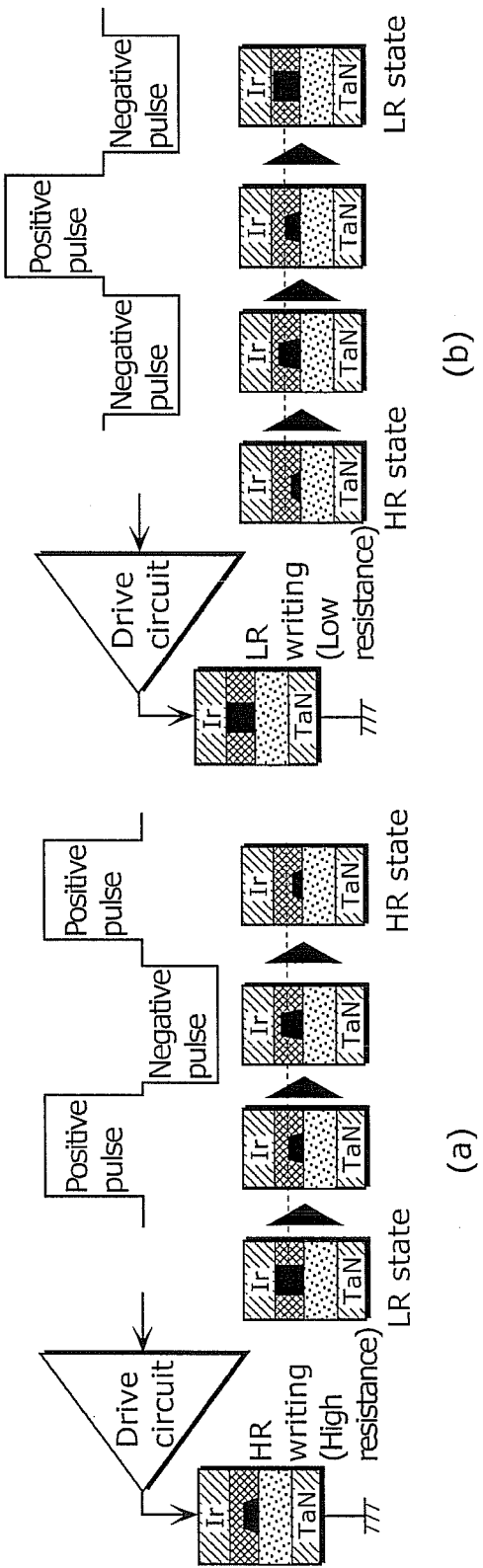
[FIG. 16]

(a) and (b) in FIG. 16 are a diagram showing a characteristic of HR writing and a diagram showing a characteristic of LR writing in the present invention, respectively.

[FIG. 17]

Figure 17:
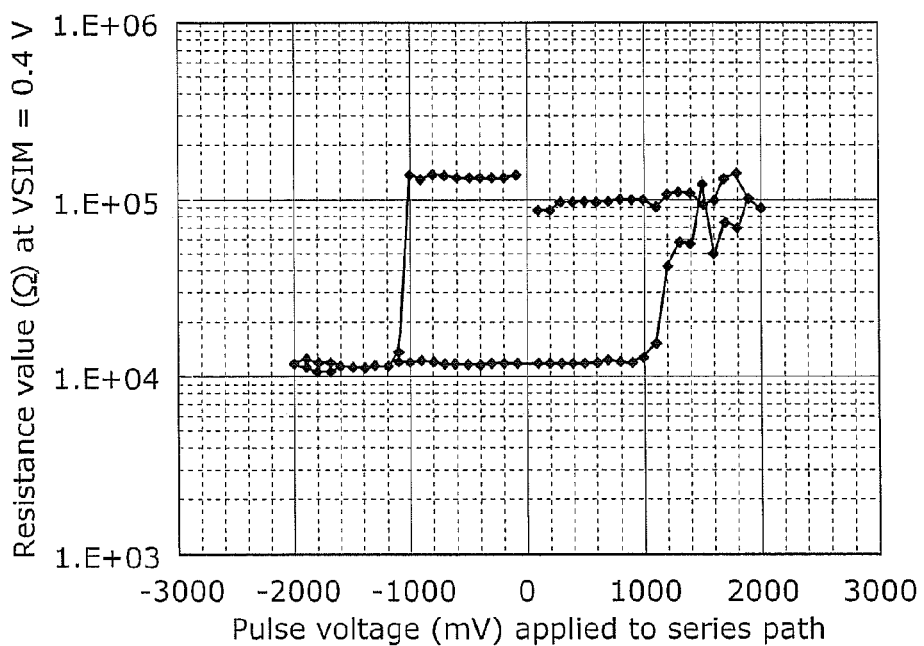

FIG. 17 is a graph showing a specific example of a voltage-resistance change characteristic of the variable resistance element in the nonvolatile storage device according to Embodiment 1 of the present invention.

[FIG. 18]

Figure 18:
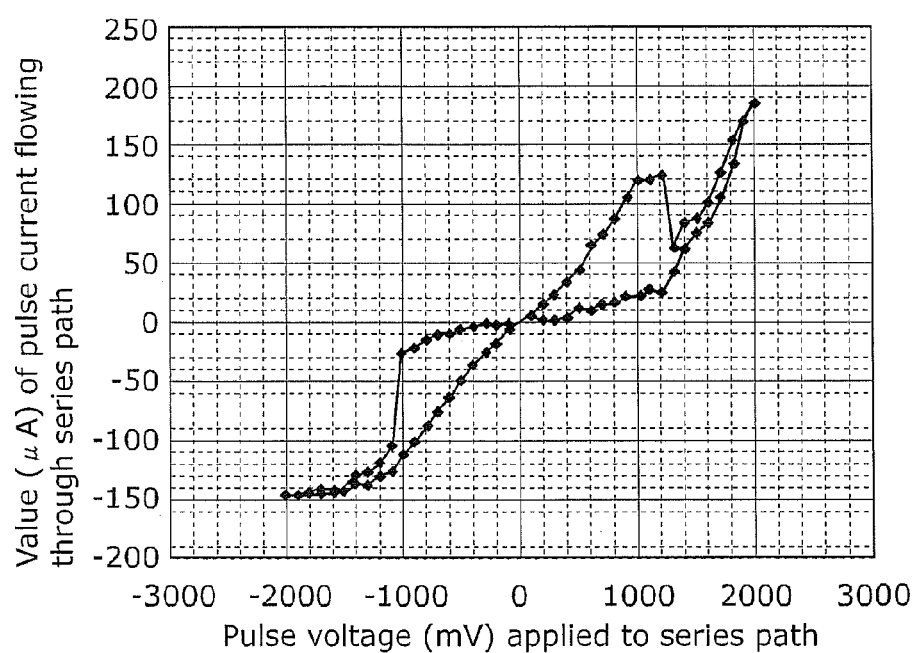

FIG. 18 is a graph showing a specific example of a voltage-current characteristic of the variable resistance element in the nonvolatile storage device according to Embodiment 1 of the present invention.

[FIG. 19]

Figure 19:
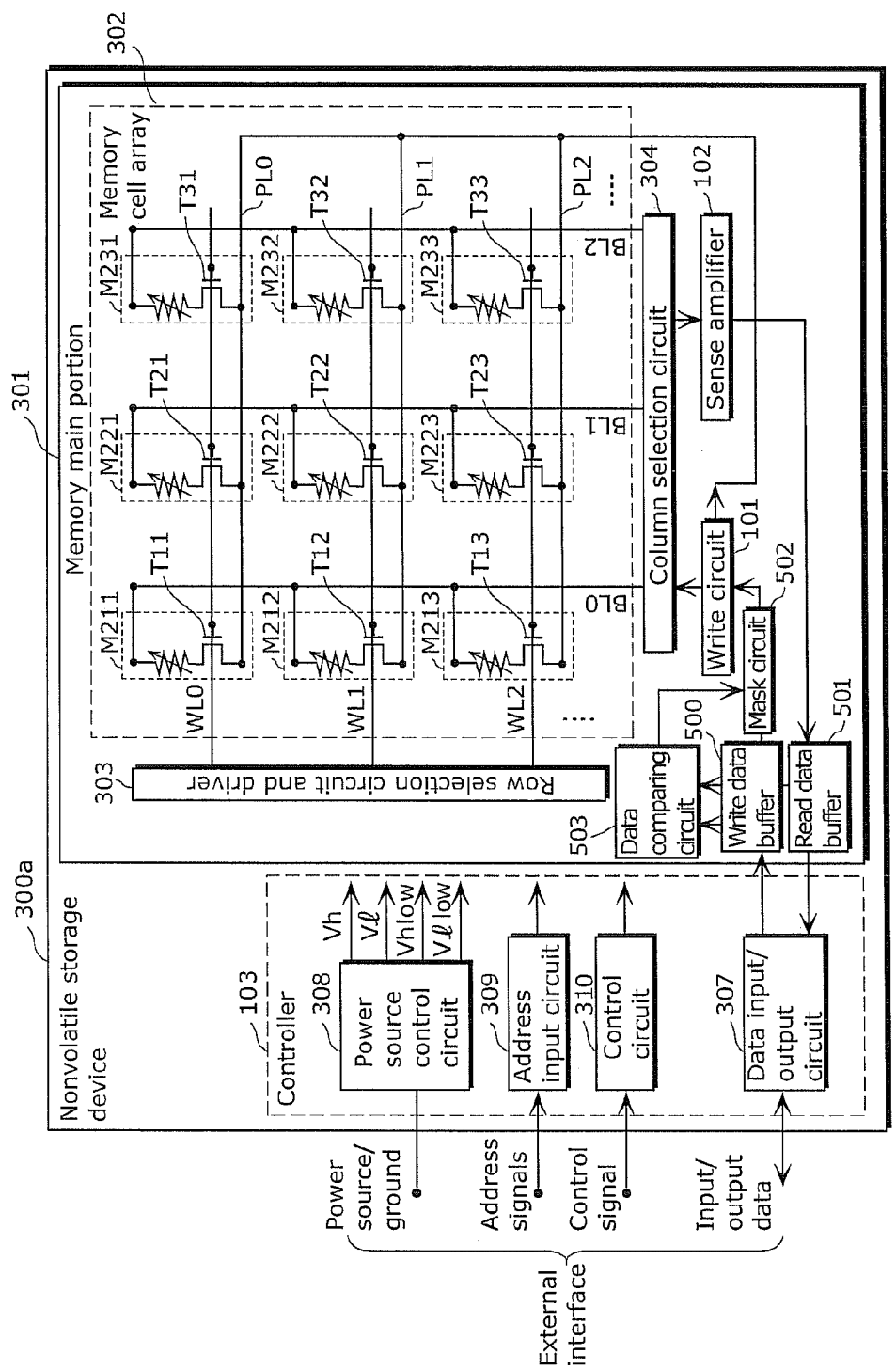

FIG. 19 is a block diagram showing an example of a nonvolatile storage device according to Embodiment 2 of the present invention.

[FIG. 20]

Figure 20:
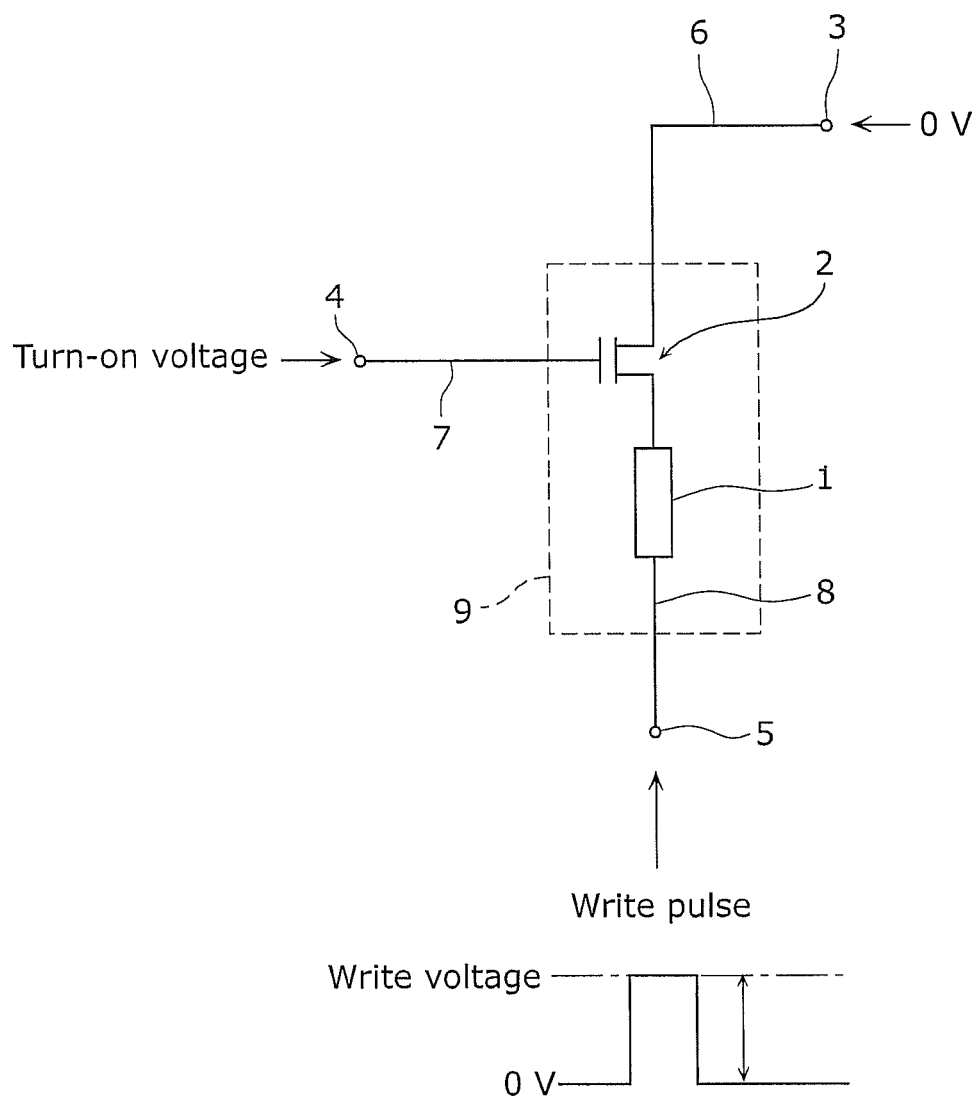

FIG. 20 is a diagram showing an application state of a voltage pulse at the time of performing a write operation in a memory cell according to a conventional technique in PTL 1.

[FIG. 21]

Figure 21:
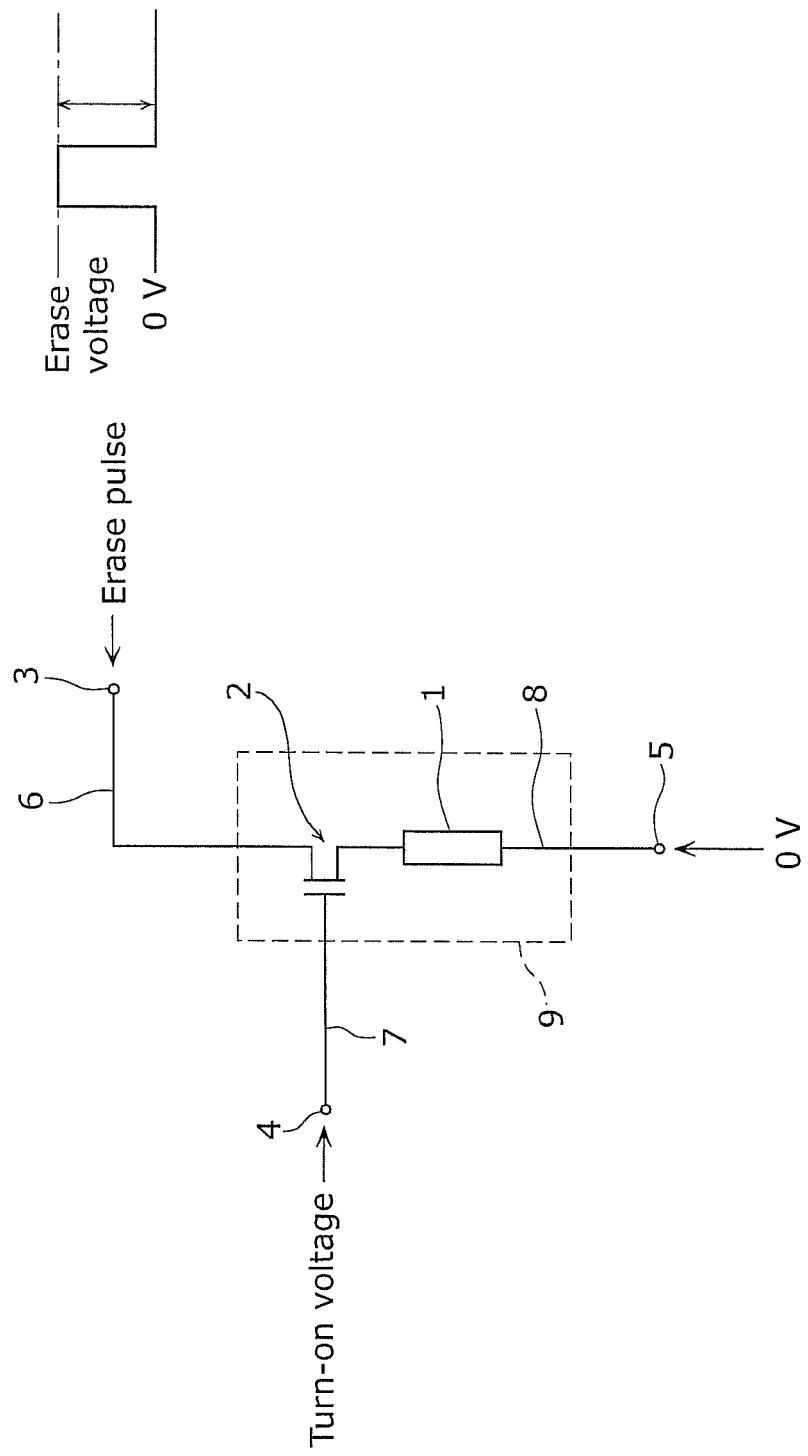

FIG. 21 is a diagram showing an application state of a voltage pulse at the time of performing an erase operation in the memory cell according to the conventional technique in PTL 1.

[FIG. 22]

Figure 22:
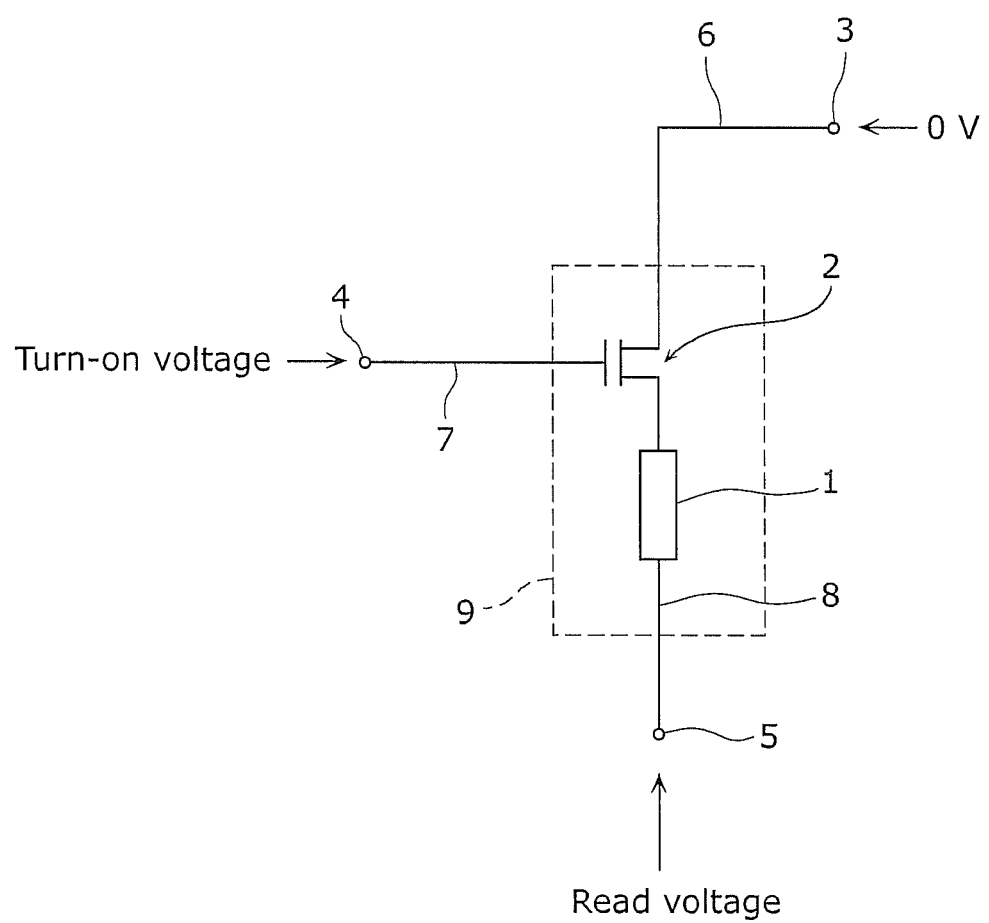

FIG. 22 is a diagram showing an application state of a voltage pulse at the time of performing a read operation in the memory cell according to the conventional technique in PTL 1.

[FIG. 23]

Figure 23:
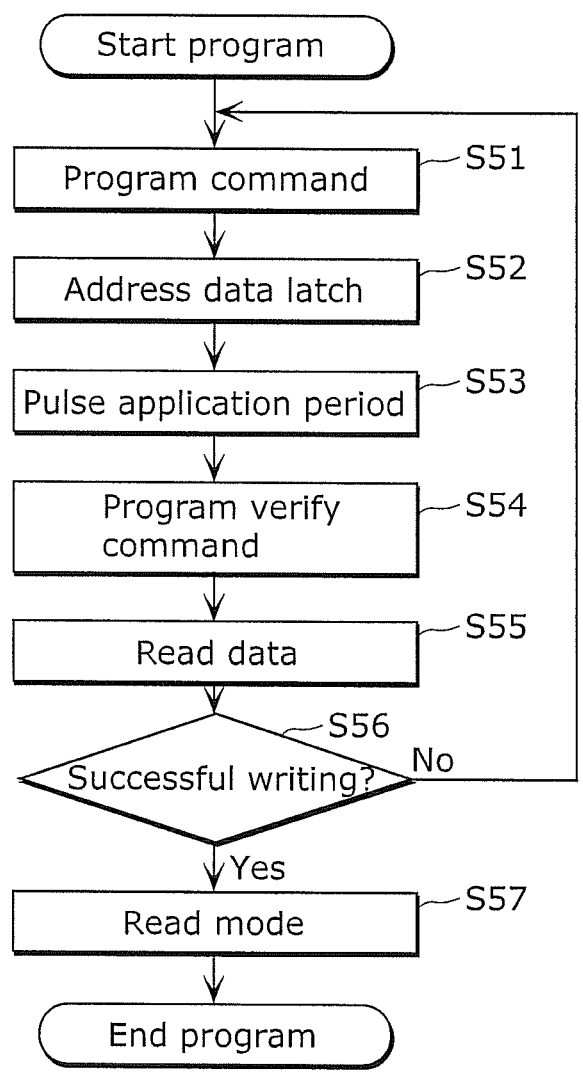

FIG. 23 is a flowchart for a conventional verify operation according to a conventional technique in PTL 2 and PTL 3.

[FIG. 24]

Figure 24:
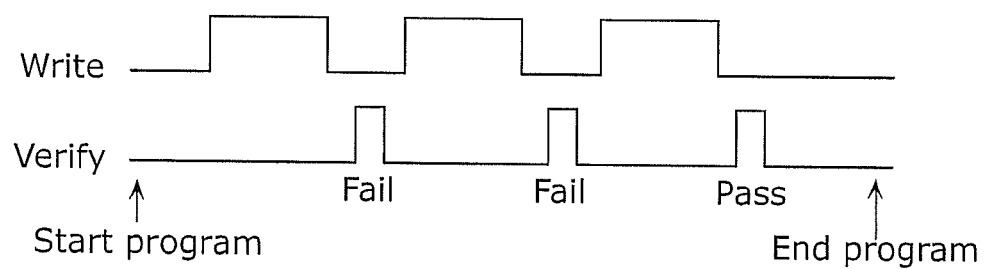

FIG. 24 is a timing diagram for the conventional verify operation according to the conventional technique in PTL 2 and PTL 3.

DESCRIPTION OF EMBODIMENTS

The following describes embodiments of the present invention with reference to the drawings.

(Embodiment 1)

[Device Configuration]

(a) in FIG. 1 is a block diagram showing an example of a basic configuration of a nonvolatile storage device 100a according to Embodiment 1 of the present invention, and (b) in FIG. 1 is a block diagram showing an example of a basic configuration of a nonvolatile storage device 100b according to Embodiment 1 of the present invention. First, cases of performing conventional writing into and reading from a memory cell are described with reference to FIG. 1. It is to be noted that, in the DESCRIPTION, more strictly speaking, the writing into and reading from the memory cell means writing into and reading from a variable resistance element included in the memory cell. In addition, more strictly speaking, a resistance state of the memory cell means a resistance state of the variable resistance element included in the memory cell.

The nonvolatile storage device 100a in (a) in FIG. 1 includes a memory cell 105a in which a variable resistance element 106 is series-connected to a three-terminal selection element 107. Examples of the three-terminal selection element 107 include a MOSFET, a bipolar transistor, and so on. Although, for the sake of convenience of description, (a) in FIG. 1 shows one memory cell 105a, as will become apparent below, normally, a plurality of memory cells are arranged in an array of rows and columns. To select one of the memory cells, the three-terminal selection element 107 is provided, and selecting switches which select the rows and columns of the memory array are provided between a node A and a switch circuit 104, and a node B and a write circuit, the selecting switches being omitted in (a) and (b) in FIG. 1. Further, a selecting switch is also provided between the three-terminal selection element 107 and a gate voltage driver 109 in (a) in FIG. 1. A write circuit 101 is a circuit for writing data into the memory cell 105a (more strictly speaking, the variable resistance element 106), and applies a predetermined write voltage pulse to both ends of each of the nodes A and B by switching between power sources for write process Vh, Vl, VhLow, VlLow, and ground level (GND, 0 V) to be inputted. A sense amplifier 102 is an example of a read circuit which reads a resistance state of the variable resistance element 106, and reads data stored in the memory cell 105a. Examples of such a method for reading are various, and include: a method for supplying a predetermined read current in a direction indicated by an arrow 108, judging whether the variable resistance element 106 is in a high resistance state or a low resistance state, by comparing, with a predetermined reference voltage, a voltage difference between the nodes A and B at the time of the current supply, and reading data stored in the memory cell 105a; and a method for applying a predetermined voltage to both ends of each of the nodes A and B, and judging whether or not the variable resistance element 106 is in a high resistance state or a low resistance state, based on a temporal difference from when the voltage application is stopped to when a voltage between the nodes A and B is discharged. It is to be noted that the example of the sense amplifier 102 is to be described in detail later. The gate voltage driver 109 switches a conduction state of the memory cell 105a by switching whether or not to apply a predetermined voltage to a control terminal of the three-terminal selection element 107 in the memory cell 105a. The switch circuit 104 switches whether to connect the node A to the write circuit 101 or the sense amplifier 102. A controller 103 controls the write circuit 101, the sense amplifier 102, the switch circuit 104, and the gate voltage driver 109 based on an instruction from an external interface, a state of read data of the memory cell 105 which is outputted from the sense amplifier 102, and so on.

The nonvolatile storage device 100b in (b) in FIG. 1 is the same as the nonvolatile storage device 100a in (a) in FIG. 1 except that a memory cell 105b includes a two-terminal selection element 110, and the gate voltage driver 109 in (a) in FIG. 1 which has become unnecessary is removed accordingly. Examples of the two-terminal selection element 110 include a nonlinear current element such as a bidirectional diode. A semiconductor storage device in which memory cells 105b each including the two-terminal selection element 110 are arranged in an array is a publicly known technique such as a cross-point fuse memory, and a detailed description thereof is omitted. Switching a voltage level between the nodes A and B switches between a conduction state and a nonconduction state of the memory cell 105b. In other words, applying a pulse having a voltage level obtained by adding a rewrite voltage of the variable resistance element 106 to a predetermined turn-on voltage of the two-terminal selection element 110 rewrites the resistance state of the variable resistance element 106. Moreover, a pulse having a voltage level obtained by adding, to the turn-on voltage of the two-terminal selection element 110, a read voltage lower than the rewrite voltage of the variable resistance element 106 is applied, and the resistance state of the variable resistance element 106 is determined by, for instance, detecting an amount of current at the time of the voltage application. It goes without saying that the power sources for write process Vh, Vl, VhLow, and VlLow shown in (b) in FIG. 1 need to be added to the turn-on voltage of the two-terminal selection element 110 as stated above, and thus have the same symbols as but differ in actual voltage from the power sources for write process of the nonvolatile storage device 100a. The present invention may use either of the configurations of the nonvolatile storage devices 100a and 100b, but the following describes in detail the configuration of the nonvolatile storage device 100a as an example.

Figure 2:
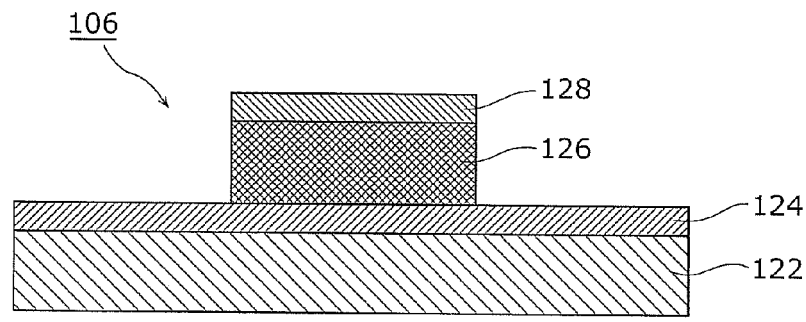
[FIG. 2]

The following describes a structure of the variable resistance element 106 with reference to FIG. 2. The variable resistance element 106 includes a first electrode (a lower electrode 124 formed on a substrate 122 in an example of FIG. 2, and hereafter referred to as the "lower electrode 124" for the sake of convenience of description), a second electrode (an upper electrode 128 in the example of FIG. 2, and hereafter referred to the "upper electrode 128" for the sake of convenience of description), and a variable resistance layer 126 provided between the lower electrode 124 and the upper electrode 128.

Materials used for the lower electrode 124 and the upper electrode 128 are Pt (platinum), Ir (iridium), Pd (palladium), W (tungsten), Cu (copper), Al (aluminum), TiN (titanium nitride), TaN (tantalum nitride), TiAlN (titanium aluminum nitride), and so on. It is to be noted that although the lower electrode 124 has a broader shape than that of the upper electrode 128, the structure of the variable resistance element 106 according to an implementation of the present invention is not limited to this, and it goes without saying that the lower electrode 124 is appropriately formed to have an optimal shape according to a semiconductor process such as by being applied to part of a wiring plug.

For instance, a material used for the variable resistance layer 126 is an oxygen-deficient transition metal oxide (preferably an oxygen-deficient Ta oxide). The oxygen-deficient transition metal oxide is referred to an oxide having an oxygen content (atom ratio: a ratio of the number of oxygen atoms to the total atoms) lower than that of an oxide having a stoichiometric composition. Generally, the oxide having the stoichiometric composition includes an insulator or has a very high resistance value. For example, when the transition metal oxide is Ta, its stoichiometric composition is expressed as $Ta_2O_5$, and the ratio of the number of O atoms to the number of Ta atoms (O/Ta) is 2.5. Thus, in the oxygen-deficient Ta oxide, the atom ratio between O atoms and Ta atoms is larger than 0 and smaller than 2.5. In this embodiment, it is preferred that the oxygen-deficient transition metal oxide be the oxygen-deficient Ta oxide. It is more preferred that the variable resistance layer 126 have at least a stack structure in which a first tantalum containing layer having a composition expressed as $TaO_x$ (where $0<x<2.5$) and a second tantalum containing layer having a composition expressed as $TaO_y$ (where $x<y$) are stacked. It goes without saying that other layers such as a third tantalum containing layer and another transition metal oxide layer can be appropriately arranged. Here, it is preferred that TaOx satisfy $0.8 \le x \le 1.9$, and TaOy satisfy $2.1 \le x \le 2.5$. It is preferred that the second tantalum containing layer have a thickness from 1 nm to 8 nm. In other words, it is preferred that the variable resistance layer 126 have a stack structure in which a first tantalum containing layer having a low oxygen content atomic percentage and a second tantalum containing layer having a high oxygen content atomic percentage are stacked. To put it differently, it is preferred that the variable resistance layer 126 have a stack structure in which a first tantalum containing layer having a high degree of oxygen deficiency and a second tantalum containing layer having a low degree of oxygen deficiency are stacked. Here, the degree of oxygen deficiency is referred to a ratio of an amount of deficient oxygen to an amount of oxygen in a transition metal oxide having a stoichiometric composition. For instance, when the transition metal oxide is tantalum (Ta), its stoichiometric composition is expressed as $Ta_2O_5$, that is, can be expressed as $TaO_{2.5}$. Thus, a degree of oxygen deficiency of $TaO_{2.5}$ is 0%, and a degree of oxygen deficiency of an oxygen-deficiency tantalum oxide $TaO_{1.5}$ is calculated as $(2.5-1.5)/2.5=40\%$. Moreover, an oxygen content atomic percentage of $Ta_2O_5$ is calculated by a ratio of the number of O atoms to the number of the all atoms (O/(Ta+O)), and is 71.4 atm %. Therefore, the oxygen-deficient tantalum oxide has the oxygen content atomic percentage greater than 0 and smaller than 71.4 atm %.

Here, a transition metal other than tantalum may be used as a metal comprised in the variable resistance layer 126. Examples of the transition metal include tantalum (Ta), titanium (Ti), hafnium (Hf), zirconium (Zr), niobium (Nb), and tungsten (W). The transition metal can be a plurality of kinds of oxide, and thus can achieve different resistance states through oxidation-reduction reaction. For example, in the case of using hafnium oxide, it has been verified that a resistance value of the variable resistance layer 126 having a stack structure in which a first hafnium oxide layer and a second hafnium oxide layer are stacked is varied stably and at high speed when a composition of the first hafnium oxide layer is expressed as $HfO_x$ where x is between 0.9 and 1.6 inclusive and a composition of the second hafnium oxide layer is expressed as $HfO_y$ where y is greater than x. In this case, it is preferred that the second hafnium oxide layer have a film thickness from 3 nm to 4 nm. Moreover, in the case of using zirconium oxide, it has been verified that a resistance value of the variable resistance layer 126 having a stack structure in which a first zirconium oxide layer and a second zirconium oxide layer are stacked is varied stably and at high speed when a composition of the first zirconium oxide layer is expressed as $ZrO_x$ where x is between 0.9 and 1.4 inclusive and a composition of the second zirconium oxide layer is expressed as $ZrO_y$ where y is greater than x. In this case, it is preferred that the second zirconium oxide layer have a film thickness from 1 nm to 5 nm.

It is to be noted that when the variable resistance layer 126 has the stack structure in which the first and second transition metal oxide layers are stacked, a first transition metal comprised in the first transition metal oxide layer may be different from a second transition metal comprised in the second transition metal oxide layer. In this case, it is preferred that the second transition metal oxide layer have a lower degree of oxygen deficiency than that of the first transition metal oxide layer, that is, higher resistance. With such a configuration, a voltage applied between the lower electrode 124 and the upper electrode 128 at the time of a resistance change is distributed more to the second transition metal oxide layer, which allows oxidation-reduction reaction to easily occur in the second transition metal oxide layer. Moreover, when the first transition metal is different from the second transition metal in material, it is preferred that a standard electrode potential of the second transition metal be lower than that of the first transition metal. This is because it is considered that a resistance change phenomenon is caused by a change of a resistance value due to oxidation-reduction reaction occurring in a tiny filament (conductive path) formed in the second transition metal oxide layer having high resistance. For example, using the oxygen-deficient tantalum oxide and the titanium oxide ($TiO_2$) for the first and second transition metal oxide layers, respectively, achieves a stable resistance change operation. Titan (standard electrode potential=−1.63 eV) is a material having a lower standard electrode potential than that (standard electrode potential=−0.6 eV) of tantalum. The standard electrode potential indicates a characteristic that the larger its value is, the more easily oxidation does not occur. Using, for the second transition metal oxide layer, an oxide of a metal having a lower standard electrode potential than that of the first transition metal oxide layer allows the oxidation-reduction reaction to more easily occur in the second transition metal oxide layer.

It is considered that the resistance change phenomenon in each of the variable resistance layer 126 having the stack structure including one of the materials and the variable resistance layer 126 having the stack structure including the other of the materials is caused by a change of the resistance value of the second transition metal oxide layer due to the oxidation-reduction reaction occurring in the tiny filament formed in the second transition metal oxide layer having the high resistance. In other words, it is considered that a resistance of the tiny filament is increased with occurrence of oxidation reaction in the tiny filament formed in the second transition metal oxide layer which is caused by oxygen ions in the variable resistance layer 126 being attracted to a side of the second transition metal oxide layer when a positive voltage is applied to an electrode on the side of the second transition metal oxide layer with reference to an electrode on another side. Conversely, it is considered that the resistance of the tiny filament is decreased with the occurrence of the oxidation reaction in the tiny filament formed in the second transition metal oxide layer which is caused by oxygen ions in the second transition metal oxide layer being pushed to a side of the first transition metal oxide layer when a negative voltage is applied to the electrode on the side of the second transition metal oxide layer with reference to the electrode on the other side.

The electrode connected to the second transition metal oxide layer having the lower degree of oxygen deficiency comprises a material having a higher standard electrode potential than that of the transition metal comprised in the second transition metal oxide layer or a material comprised in the electrode on the other side, such as platinum (Pt) and iridium (Ir). With such a configuration, the oxidation-reduction reaction selectively occurs in a neighborhood of an interface between the electrode and the second transition metal oxide layer in the second transition metal oxide layer, and a stable resistance change phenomenon can be observed.

Figure 3:
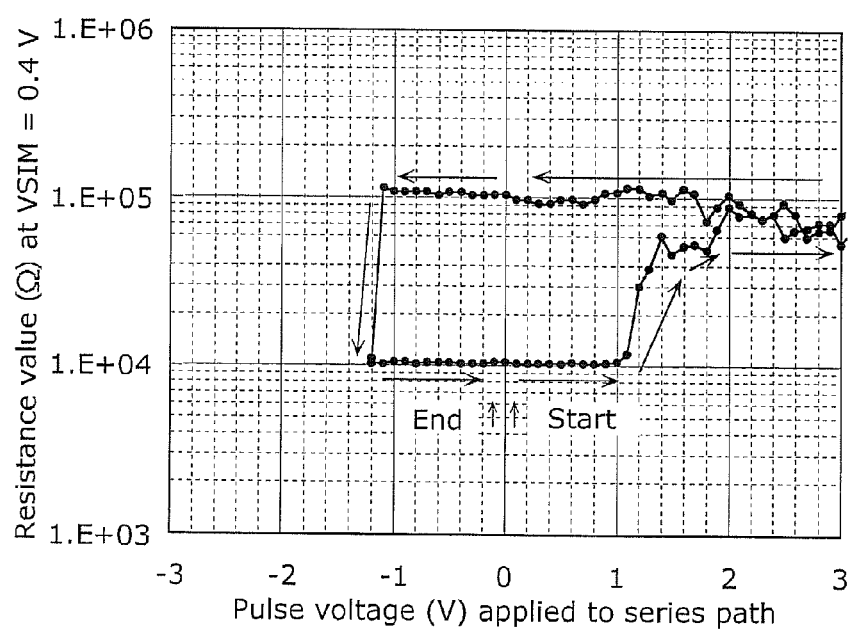
[FIG. 3]

FIG. 3 shows an example of a characteristic of the memory cell 105a having such a configuration. In FIG. 3, the horizontal axis indicates an applied pulse voltage, and the vertical axis indicates a resistance value, of the memory cell 105a, between the nodes A and B after the pulse is applied (a measured voltage is a voltage which does not cause resistance change, and is 0.4 V here). When a voltage level is gradually increased from a start position in FIG. 3 toward a positive polarity side, the resistance value of the memory cell 105a gradually increases when a voltage of both ends of the memory cell 105a exceeds 1.1 V. When the voltage is 2.0 V, the resistance value reaches approximately 100 kΩ. Conversely, when the voltage level is gradually decreased toward a negative polarity side and the voltage is reduced to below −1.1 V, the memory cell 105a changes to a low resistance state, that is, the resistance value reaches approximately 10 kΩ. It is clear that the resistance value is restored to the resistance value at the start position. Here, voltage application which causes a current to flow in the direction indicated by the arrow 108 in (a) in FIG. 1 is defined as positive voltage application, and the variable resistance element 106 changes to a high resistance state (hereafter appropriately referred to as a "HR state" or simply referred to as "HR") at the time of the positive voltage application. In addition, voltage application which causes the current to flow in a direction opposite to the direction indicated by the arrow 108 is defined as negative voltage application, and the variable resistance element 106 changes to a low resistance state (hereafter appropriately referred to a "LR state" or simply referred to "LR") at the time of the negative voltage application. Moreover, speaking of a relationship between a resistance element structure and application voltage polarity, when the variable resistance layer 126 has the stack structure in which the first tantalum containing layer having the composition expressed as $TaO_x$ (where $0<x<2.5$) and the second tantalum containing layer having the composition expressed as $TaO_y$ (where $x<y$) are stacked, voltage application which causes a current to flow from the second tantalum containing layer to the first tantalum containing layer is defined as positive voltage application, and the variable resistance layer 126 changes to the HR state at the time of the positive voltage application, and changes to the LR state at the time of negative voltage application that is opposite to the positive voltage application.

Assuming that, in the voltage applied between the nodes A and B, a voltage level changing LR to HR is a threshold voltage for high resistance writing (Vh) and a voltage level changing HR to LR is a threshold voltage for low resistance writing (Vl), it is clear that the low resistance state and the high resistance state can be sufficiently changed between using a common power supply voltage, when absolute values are |Vh|=|Vl|=2.4 V or greater. In other words, the variable resistance element 106 has a property of (i) changing from a first resistance state (e.g. LR) in which first data (e.g. "1") is stored to a second resistance state (e.g. HR) in which second data (e.g. "0") is stored, when a pulse of a first voltage (e.g. the threshold voltage for high resistance writing Vh) is applied to the variable resistance element 106 and (ii) changing from the second resistance state (e.g. HR) to the first resistance state (e.g. LR) when a pulse of a second voltage (e.g. the threshold voltage for low resistance writing Vl) having a different polarity from that of the first voltage (e.g. Vh) is applied to the variable resistance element 106. It is to be noted that contrary to the above description, as an example, the "first voltage" and the "second voltage" may be the threshold voltage for low resistance writing Vl and the threshold voltage for high resistance writing Vh, respectively. In this case, the first data and the second data are "0" and "1", respectively, and the first resistance state and the second resistance state are HR and LR, respectively.

In the light of the above, to begin with, the following describes examples of conventional writing operations with reference to (a) in FIG. 1. It is to be noted that a series of operations of each of circuits are performed based on an instruction from the controller 103. Moreover, it is assumed that a power supply voltage VDD of the nonvolatile storage device 100a is 3.3 V, for instance.

First, the following describes a writing operation which changes the variable resistance element 106 to the HR state.

The switch circuit 104 is connected to the write circuit 101 in advance, and the write circuit 101 outputs a ground level (GND or 0 V) to the nodes A and B. Next, the gate voltage driver 109 causes the memory cell 105a to be in a conduction state by applying, to a gate of the three-terminal selection element 104 in the memory cell 105a, a voltage (e.g. VDD) equal to or higher than a write voltage, and the write circuit 101 outputs, to the node B, a pulse having a predetermined width which changes a potential of the node A from 0 V through Vh to 0 V. After the pulse is applied and the nodes A and B both indicate 0 V, the gate voltage driver 109 causes the memory cell 105a to be in a nonconduction state by setting a gate voltage of the memory cell 105a at 0 V, and ends the writing operation. With this, a current flows in the direction indicated by the arrow 108, and a pulse having a positive polarity which changes the variable resistance element 106 to the HR state is applied to the memory cell 105a.

Next, the following describes a writing operation which changes the variable resistance element 106 to the LR state.

The switch circuit 104 is connected to the write circuit 101 in advance, and the write circuit 101 outputs a write voltage level for LR (Vl) between the nodes A and B. Next, the gate voltage driver 109 causes the memory cell 105a to be in the conduction state by applying, to the gate of the three-terminal selection element 104 in the memory cell 105a, the voltage (e.g. VDD) equal to or higher than the write voltage, and the write circuit 101 outputs, to the node B, a pulse having a predetermined width which changes the potential of the node A from Vl through 0 to Vl. After the pulse is applied and the nodes A and B both indicate Vl, the gate voltage driver 109 causes the memory cell 105a to be in the nonconduction state by setting the gate voltage of the memory cell 105a at 0 V, and ends the writing operation. With this, a current flows in a direction opposite to the direction indicated by the arrow 108, and a pulse having a negative polarity which changes the variable resistance element 106 to the LR state is applied to the memory cell 105a. It is to be noted that in view of safety of the circuits, the potential of each of the nodes A and B may be changed from the Vl level to 0 at the time of ending the writing operation. In addition, it goes without saying that an order of voltage application to the nodes A and B and the gate is not limited to the above, and various combinations are conceivable.

Figure 4:
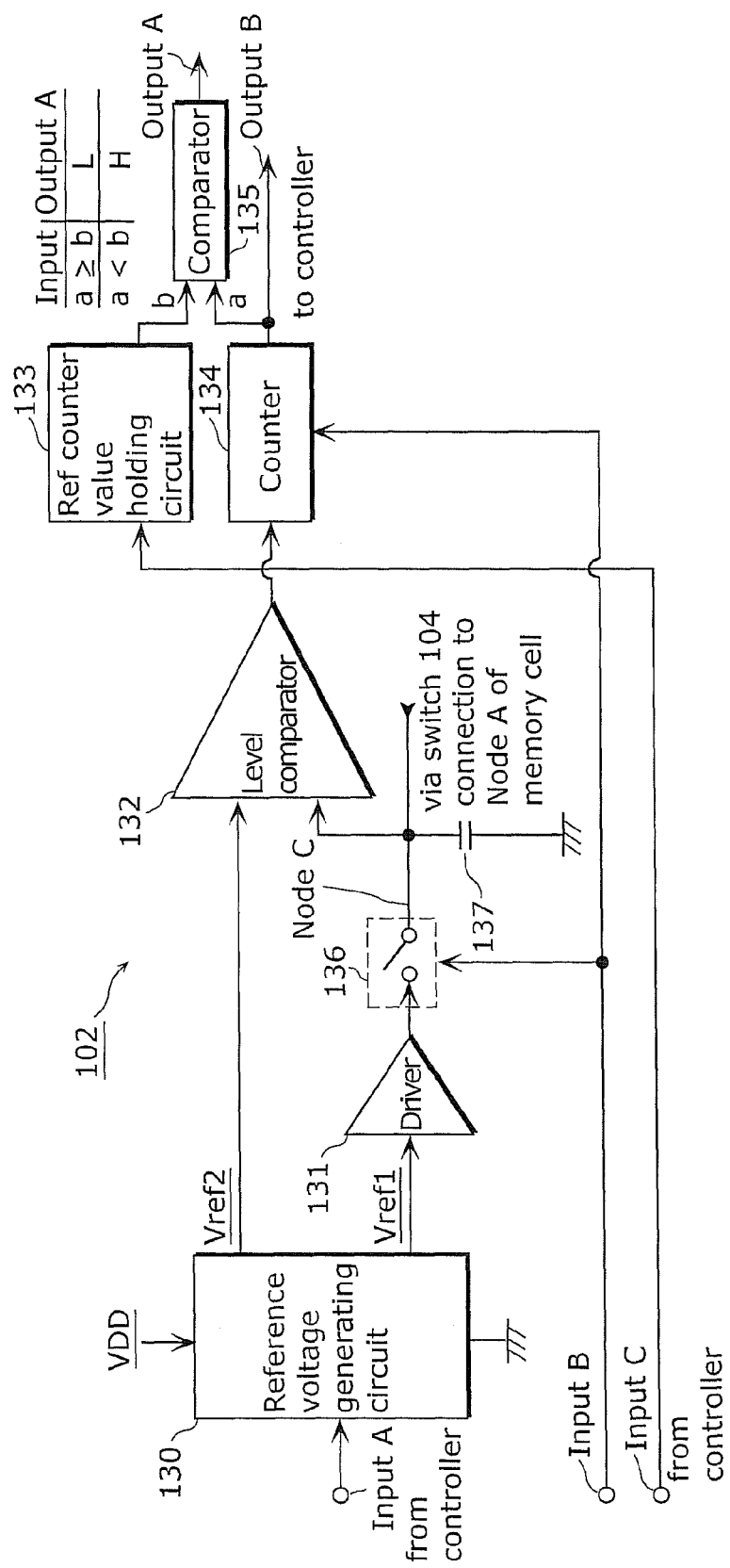
[FIG. 4]
Figure 5:
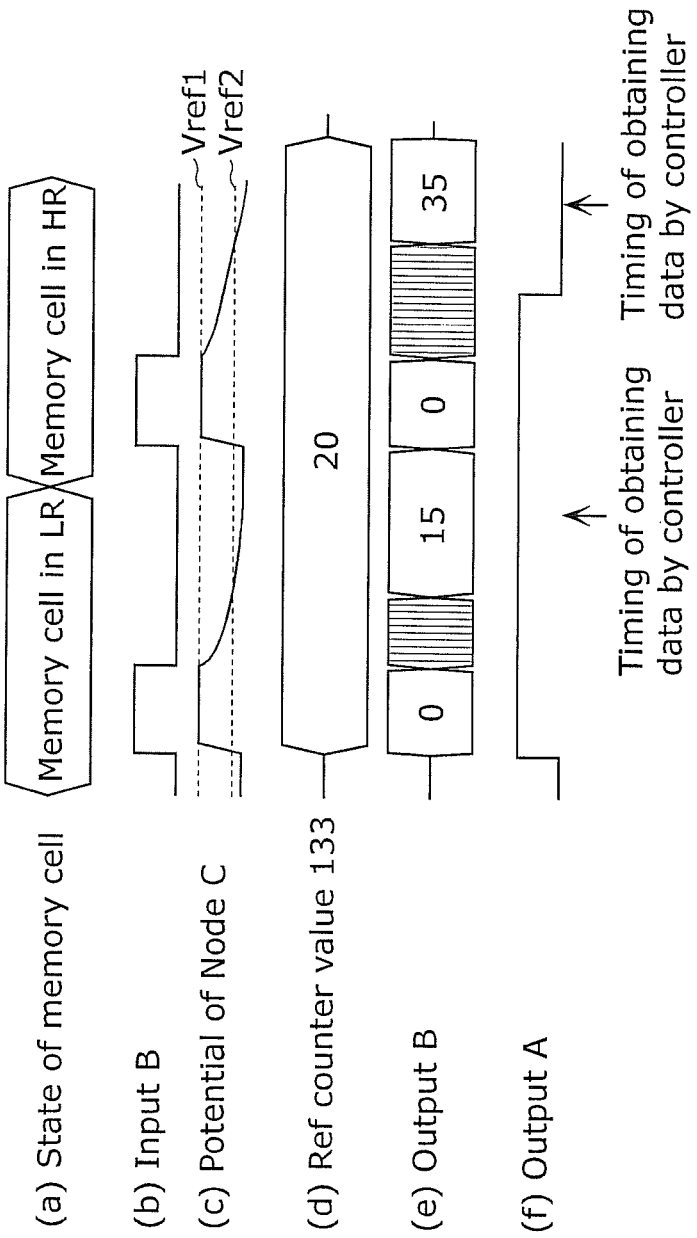
[FIG. 5]
Each of (a) to (f) in FIG. 5 is a conceptual diagram illustrating a method for (i) causing the sense amplifier shown in FIG. 4 to decode data to original digital data by specifically determining resistance values of memory cells and (ii) reading a correlation value corresponding to a resistance value of each cell.

The following describes a specific example and operations of the sense amplifier 102 with reference to FIGS. 4 and 5. FIG. 4 is a block diagram showing the specific example of the sense amplifier 102, and FIG. 5 is a timing diagram for major parts which illustrates the operations. In FIG. 4, a reference voltage generation circuit 130 generates, using a ladder resistor or the like, predetermined voltage levels from a potential difference between the power supply voltage VDD and the ground level, based on an instruction from the controller 103 which receives an input A, selects, using a semiconductor switch, a reference voltage Vref1 and a reference voltage Vref2 from among the voltage levels, and outputs the reference voltage Vref1 and the reference voltage Vref2. It is to be noted that the following relationship can be readily inferred from circuit design of a subsequent stage: the reference voltage Vref1>the reference voltage Vref2. Moreover, the switch circuit 136 is turned on when a switch control signal indicates 'H' which the controller 103 provides to an input B, and is turned off when the switch control signal indicates 'L'. The switch circuit 136 changes a node C to a HiZ (high impedance) state. Thus, when the switch control signal indicates 'H', a driver 131 provides a potential of the reference voltage Vref1 to the node C. It is to be noted that although, actually, input and output voltage values differ slightly from each other depending on voltage drop in the driver 131, transistors included in other circuits, lines, and so on, it is assumed that there is no voltage drop or the like for the sake of convenience of description.

The node C is connected to the node A via the switch circuit 104 shown in (a) in FIG. 1, and at this time the node B is grounded to 0 V by the write circuit 101. As shown in FIG. 4, a capacitor 137 is connected in parallel to the memory cell 105a, between the node C and the ground. It is to be noted that the capacitor 137 may be replaced with wiring capacitance, transistor capacitance, and so on, or may be actively added in terms of device design. As stated above, when the switch control signal which is provided to the input B indicates 'H', the node C is driven by the reference voltage Vref1. Subsequently, when the switch control signal indicates 'L', the switch circuit 136 is turned OFF, and the node C is changed to the HiZ state. As a result, the node C is discharged with a time constant according to the resistance value of the variable resistance element 106 in the memory cell 105a connected in parallel to the capacitor 137, and the potential of the node C gradually decreases from the reference voltage Vref1. To put it differently, the lower the resistance value of the memory cell 105a is, the faster the potential decreases, and the larger the resistance value of the memory cell 105a is, the slower the potential decreases. These operations are easily understood with reference to (a) to (f) in FIG. 5. As shown in (a) "State of memory cell" in FIG. 5, the first half shows that the memory cell 105a is in the low resistance state (LR), and the latter half shows that the memory cell 105a is in the high resistance state (HR). It is clear that, in each of the first and latter halves, the input B is changed to 'H' with a timing shown in (b) in FIG. 5, and the reference voltage Vref1 is applied to the node C for a period during which the input B indicates 'H'. When the input B is changed from 'H' to 'L', the switch circuit 136 is turned OFF and the node C is changed to the HiZ state. Consequently, as shown in (c) in FIG. 5, it is clear that the node C is gradually being discharged. Then, it is possible to verify that when the memory cell 105a is in LR, the potential of the node C quickly exceeds a threshold value of a reference voltage Vref2, and when memory cell 105a is in HR, the potential of the node C slowly exceeds the threshold value of the reference voltage Vref2.

A level comparator 132 shown in FIG. 4 compares the reference voltage Vref2 supplied by the reference voltage generation circuit 130 with the potential of the node C, and outputs 'L' when the potential of the node C is greater than the reference voltage Vref2, or outputs 'H' when the potential of the node C is less than the reference voltage Vref2. In other words, after the switch control signal changes from 'H' to 'L', when the memory cell 105a is in the low resistance state (LR), the output of the level comparator 132 quickly changes from L to H, and when the memory cell 105a is in the high resistance state (HR), the output of the level comparator 132 slowly changes from L to H. Moreover, a counter 134 is reset to 0 for the period during which the switch control signal indicates 'H', and is counted up according to a cycle of a clock (not shown) inputted to the counter 134 when the switch control signal indicates 'L' and an input from the level comparator 132 indicates 'L'. It goes without saying that the counter 134 is limited by a predetermined upper limit so that a value does not overflow.

(e) in FIG. 5 shows an operation of the counter 134. As shown in (e) in FIG. 5, the counting up is started immediately after the input B of a counter value of the counter 134 changes to 'L'. It is clear that when the memory cell 105a is in LR, the counter value is fixed to '15', and when the memory cell 105a is in HR, the counter value is fixed to '35'.

A Ref counter value holding circuit 133 holds, according to a setting from the controller 103, a value (Ref counter value) that is a threshold value used for judging whether the memory cell 105a is in the high resistance state or the low resistance state, and outputs the held Ref counter value to a comparator 135. The comparator 135 compares a counter value (a) of the counter 134 to a Ref counter value (b) held in the Ref counter value holding circuit 133. When the comparison result shows a b, it is judged that the memory cell 105a is in the high resistance state and 'L' is output as an output A. When the comparison result shows a<b, it is judged that the memory cell 105a is in the low resistance state and 'H' is outputted as an output A. The Ref counter value is '20' in (d) in FIG. 5, and thus it is clear, as shown in (f) in FIG. 5, that 'H' is outputted as the output A with a timing of obtaining data by the controller 103 when the memory cell 105a is in LR, and 'L' is outputted as the output A with a timing of obtaining data by the controller 103 when the memory cell 105a is in HR. It goes without saying that the Ref counter value ('20') held in the Ref counter value holding circuit 133 shown in (d) in FIG. 5 or the counter value ('15' or '35') of the counter 134 shown in (e) in FIG. 5 is not limited to such a value, and that the value varies depending on variation or the like in a count clock frequency of the counter 134, a value of the capacitor 137, and even set values of the reference voltages Vref1 and Vref2, and a resistance value of the memory cell.

As stated above, the sense amplifier 102 reads the resistance state of the memory cell 105a to be read, by taking advantage of a characteristic that a time for discharging the voltage level applied to the memory cell 105a differs depending on the resistance value of the memory cell 105a (more strictly speaking, the variable resistance element 106). As a result, a binary digital logical value corresponding to the resistance state is outputted as the output A, and the counter value corresponding to a more detailed resistance value is outputted as the output B using resolution of the clock cycle. It is briefly stated here that a value of the output B is used for verify additional writing, and a detailed description thereof is provided later.

Each of (a) and (b) in FIG. 1 shows the basic configuration including one memory cell for the sake of convenience of description. In fact, however, the present invention can be realized as a nonvolatile storage device in which memory cells are arranged in an array. The following describes a specific example of the nonvolatile storage device and a method for writing into a selected cell with reference to FIG. 6.

Figure 6:
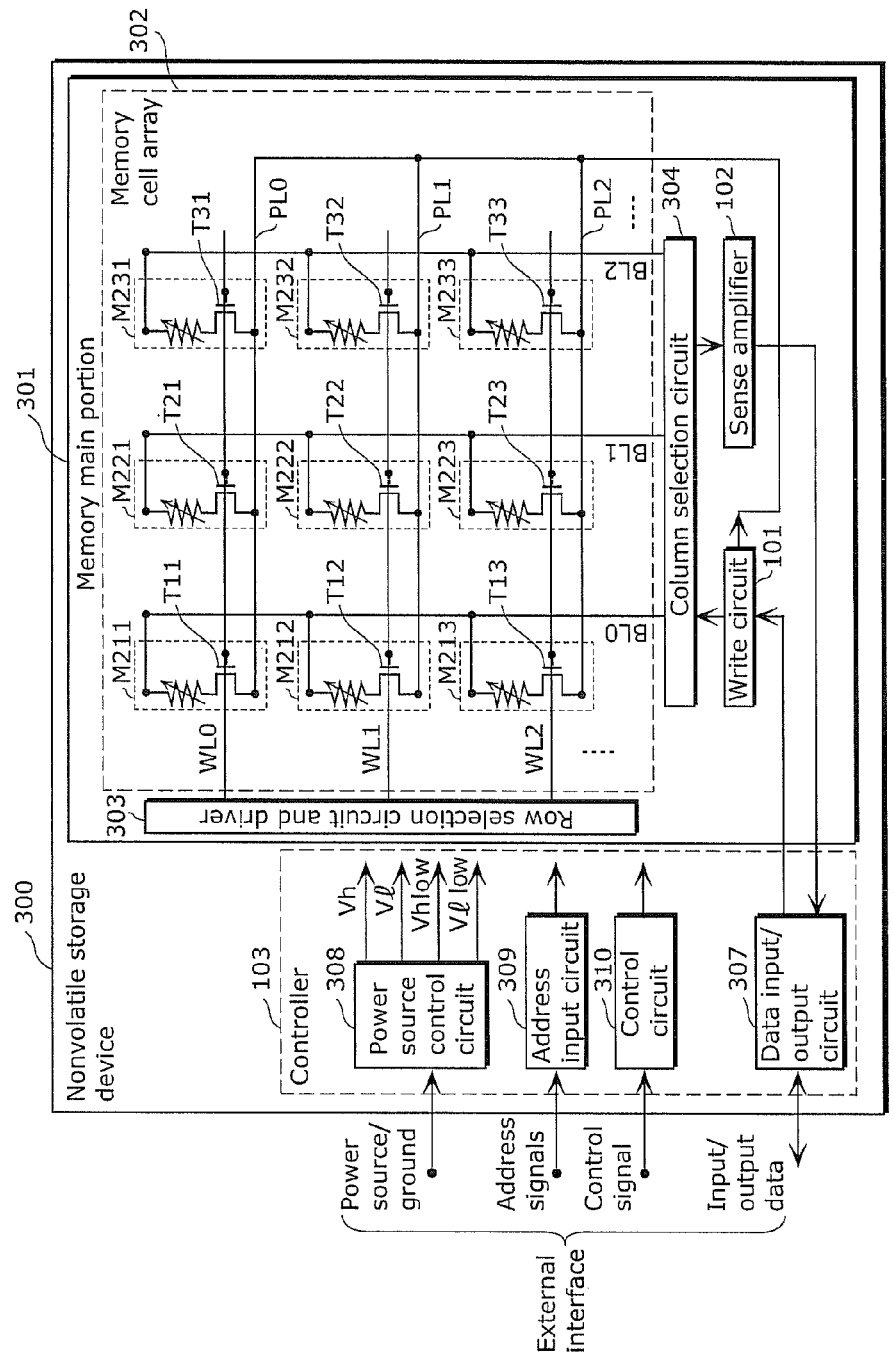
[FIG. 6]

FIG. 6 is a block diagram showing one configuration of a nonvolatile storage device 300 including memory cells in a specific array structure.

As shown in FIG. 6, the nonvolatile storage device 300 according to this embodiment includes a memory main portion 301 on a semiconductor substrate (not shown). The memory main portion 301 includes: a memory cell array 302; a row selection circuit and driver 303; a column selection circuit 304; a write circuit 101 for writing data; and a sense amplifier 102 which detects, as explained above, a resistance value of a selected memory cell and judges whether data indicates "1" or "0". Furthermore, the nonvolatile storage device 300 includes: a power source control circuit 308 which generates voltages necessary for writing data into a memory cell; an address input circuit 309 which receives address signals inputted from the outside; a control circuit 310 which controls operations of the memory main portion 301 based on a control signal inputted from the outside; and a data input and output circuit 307 which performs input and output processing of input and output data.

Among the above elements, an element having the same reference sign as in (a) in FIG. 1 indicates the same functional block as in (a) in FIG. 1. To put it differently, a combination of the power source control circuit 308, the address input circuit 309, the control circuit 310, and the data input and output circuit 307 in FIG. 6 corresponds to the controller 103 in (a) in FIG. 1. Moreover, the row selection circuit and driver 303 in FIG. 6 corresponds to the gate voltage driver 109 in (a) in FIG. 1, and the column selection circuit 304 in FIG. 6 corresponds to the switch circuit 104 in (a) in FIG. 1.

The memory cell array 302 includes: first lines (word lines WL0, WL1, WL2, . . . in the example of FIG. 6, and hereafter referred to as "word lines WL0, WL1, WL2, . . . " for the sake of convenience of description) which are formed, on the semiconductor substrate, parallel to each other in a first direction on a first plane substantially parallel to a surface of the semiconductor substrate; second lines (bit lines BL0, BL1, BL2, . . . in the example of FIG. 6, and hereafter referred to as "bit lines BL0, BL1, BL2, . . . " for the sake of convenience of description) which are formed parallel to each other in a second direction on a second plane parallel to the first place and to three-dimensionally cross the first lines; and memory cells M211, M212, M213, M221, M222, M223, M231, M232, M233 (hereafter referred to as "memory cells M211, M212, . . . ") each of which is provided to correspond to a cross-point between corresponding ones of the word lines WL0, WL1, WL2, . . . and the bit lines BL0, BL1, BL2, . . . . Each of the memory cells M211, M212 . . . includes the memory cell 105a shown in (a) in FIG. 1. Each of the word lines WL0, WL1, WL2, . . . is connected to a gate of one of selection transistors (hereafter also simply referred to as "transistors") T11, T12, T13, T21, T22, T23, T31, T32, T33, . . . in the respective memory cells M211, M212, . . . . Each of the bit lines BL0, BL1, BL2, . . . is connected to one end of the memory cell 105a in the respective memory cells M211, M212, . . . .

The variable resistance element 106 operates as a nonvolatile memory element in the respective memory cells M211, M212, . . . . Each of the memory cells M211, M212, . . . includes one transistor and one variable resistance element 106, and thus is referred to as a 1T1R memory cell. The memory cell array 302 includes plate lines PL0, PL1, PL2, . . . arranged parallel to the word lines WL0, WL1, WL2, . . . . Each of the plate lines PL0, PL1, PL2, . . . is connected to the other end of the memory cell 105a in the respective memory cells M211, M212, . . . .

Here, as stated above, the nonvolatile memory element in the respective memory cells M211, M212, . . . includes the variable resistance layer comprising the oxygen-deficient tantalum oxide. More specifically, the nonvolatile memory element includes the lower electrode 124, the upper electrode 128, and the variable resistance layer 126 of the variable resistance element 106 shown in FIG. 2.

An example is shown where an n-channel MOS transistor is used for the respective selection transistors T11, T12, T13, . . . in the memory cell array 302 in FIG. 6. Each of the transistors T11, T12, T13, . . . has a drain connected to the bit line BL0 via the variable resistance element, each of the transistors T21, T22, T23, . . . has a drain connected to the bit line BL1 via the variable resistance element, and each of the transistors T31, T32, T33, . . . has a drain connected to the bit line BL2 via the variable resistance element.

Moreover, each of the transistors T11, T21, T31, . . . has a gate connected to the word line WL0, each of the transistors T12, T22, T32, . . . has a gate connected to the word line WL1, and each of the transistors T13, T23, T33, . . . has a gate connected to the word line WL2.

Furthermore, each of the transistors T11, T21, T31, . . . has a source connected to the plate line PL0, each of the transistors T12, T22, T32, . . . has a source connected to the plate line PL1, and each of the transistors T13, T23, T33, . . . has a source connected to the plate line PL2. It is to be noted that the relationship between the drain and the source is merely defined for the sake of convenience of description, and it goes without saying that the drain and the source are interchanged with each other depending on a direction of voltage application.

Under control of the control circuit 310, the address input circuit 309 receives address signals from an external circuit (not shown) and, based on the address signals, outputs row address signals to the row selection circuit and driver 303 and column address signals to the column selection circuit 304. Here, the address signals are signals indicating an address of a specific memory cell to be selected from among the memory cells M211, M212, . . . . Moreover, the row address signals are signals indicating an address of a row which is a part of the address indicated by the address signals, and the column address signals are signals indicating an address of a column which is a part of the address indicated by the address signals. It is to be noted that the row selection circuit and driver 303 and the column selection circuit 304 constitute a selection circuit which selects, from among the memory cells, at least one memory cell to be written or read.

In a data write cycle, the control circuit 310 outputs, to the write circuit 101, a write command signal instructing application of a write voltage, according to input data inputted to the data input and output circuit 307. On the other hand, in a data read cycle, the control circuit 310 outputs, to the sense amplifier 102 and the column selection circuit 304, a read command signal instructing a read operation.

The row selection circuit and driver 303 receives row address signals outputted from the address input circuit 309, selects any one of the word lines WL0, WL1, WL2, . . . according to the row address signals, and applies a predetermined voltage to the selected word line.

Furthermore, the column selection circuit 304 receives column address signals outputted from the address input circuit 309, selects any one of the bit lines BL0, BL1, BL2, . . . according to the column address signals, and applies a write voltage or a read voltage to the selected bit line. Here, the power source control circuit 308 generates and selectively supplies the ground level (GND, 0 V) or the predetermined applied voltages (Vh, Vl, VhLow, VlLow), and causes the voltages to be variable as necessary, depending on the direction of voltage application.

The write circuit 101 applies a predetermined potential to all of the bit lines and the plate lines, and applies a write voltage pulse to the bit line selected by the column selection circuit 304, according to a write instruction outputted from the control circuit 310.

Moreover, the sense amplifier 102 is an example of a read circuit which reads the memory cell selected in the read cycle, and judges whether data indicates "1" or "0", using a temporal difference in discharging the applied read voltage. The resultant output data is outputted to the external circuit via the data input and output circuit 307.

It is to be noted that although the source lines (plate lines) are arranged parallel to the word lines in the configuration example, the source lines (plate lines) may be arranged parallel to the bit lines. Moreover, although a common potential is applied through the source lines to the transistors connected as the plate lines, a source line selection circuit and driver having the same configuration as the row selection circuit and driver may be included, and each of a selected source line and a non-selected source line may be driven by a different voltage (including a polarity).

[Example Operation of Conventional Nonvolatile Storage Device]

Figure 7:
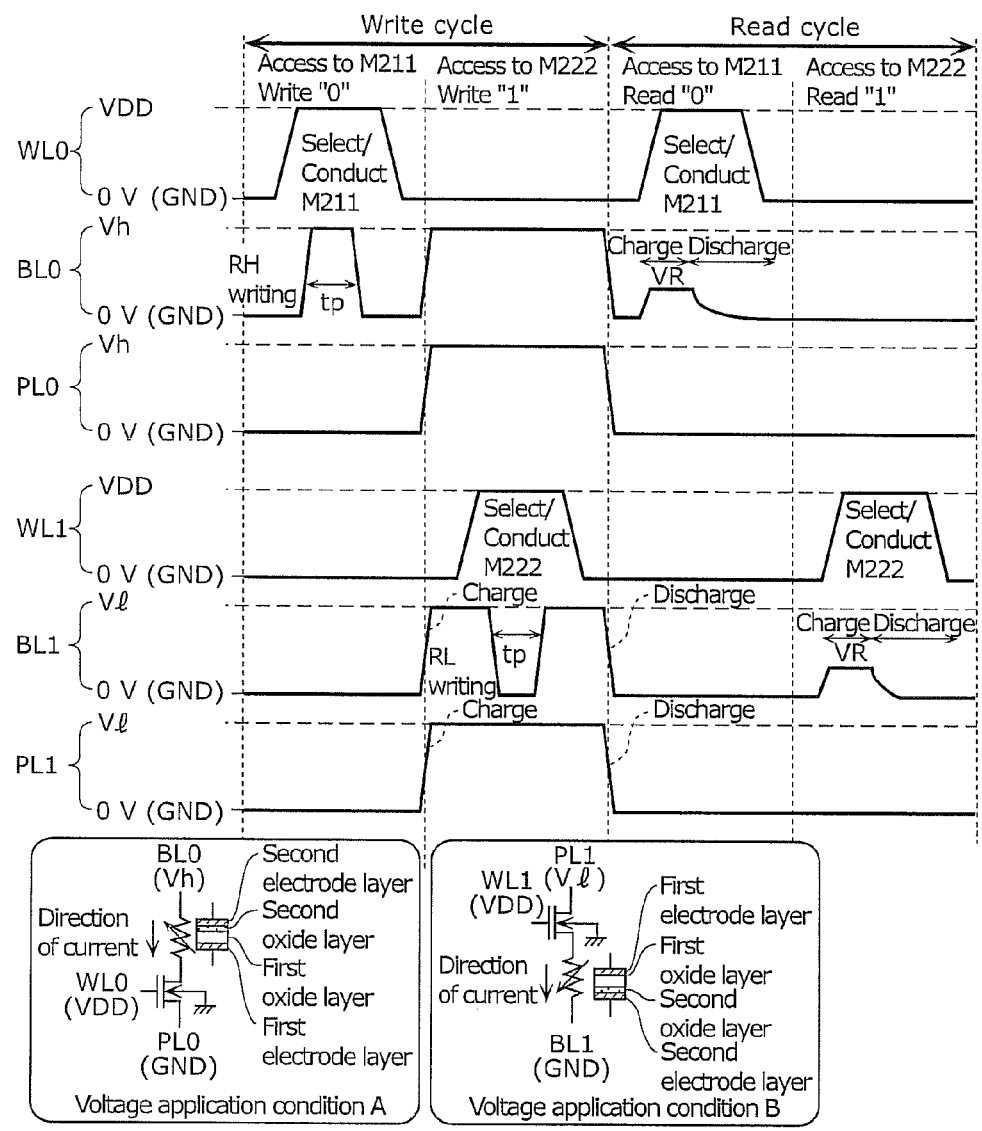
[FIG. 7]

The following describes an example operation of the nonvolatile storage device 300 in a write cycle in the case of writing data by a conventional method and a read cycle in the case of reading the written data by the conventional method, with reference to a timing diagram shown in FIG. 7.

FIG. 7 is a timing diagram showing examples of a conventional write operation and read operation of the nonvolatile storage device 300 according to an implementation of the present invention. It is to be noted that, here, the example operations are shown for when data "1" is assigned to a case where the variable resistance layer 126 is in a high resistance state and data "0" is assigned to a case where the variable resistance layer 126 is in a low resistance state. Furthermore, for the sake of convenience of description, only the cases for writing and reading data with regard to the memory cells M211 and M222 are shown.

In FIG. 7, a voltage Vh indicates a pulse voltage value of both ends of a memory cell necessary for a resistance change of the variable resistance element 106 from LR to HR. A voltage Vl indicates a pulse voltage value of the both ends of the memory cell necessary for a resistance change of the variable resistance element 106 from HR to LR. A voltage Vref1 that is a read voltage lower than a rewrite voltage (Vh or Vl) in terms of an absolute value is applied at the time of reading. Moreover, the write circuit 101 supplies the voltage Vl or GND to the plate lines depending on the direction of voltage application, and charges each bit line and each plate line to the voltage Vh, Vl, or Vref1 or discharges each bit line and each plate line to GND depending on a need to switch between a write mode and a read mode.

In a write cycle for the memory cell M211, as shown by "Access to M211 Write '0'" in FIG. 7, the write circuit 101 sets the bit line BL0 and the plate line PL0 to the GND level in advance. Then, a power supply voltage VDD is applied to the word line WL0, which causes the transistor T11 of M211 to be in a conduction state, and a pulse, of the pulse voltage Vh, having a pulse width tp is applied to the bit line BL0. With this, a threshold voltage for high resistance writing (Vh) in the case of writing the data "0" into the memory cell M211 is applied for the pulse width tp, and a variable resistance layer of the memory cell M211 changes to the high resistance state (HR writing) accordingly. In other words, the data "0" is written into the memory cell M211. The bottom left corner of FIG. 7 shows, as "Voltage application condition A", a schematic diagram showing such an application condition, and it is clear that a current flows from a second electrode layer toward a first electrode layer.

Next, in a write cycle for the memory cell M222, as shown by "Access to M222 Write '1'" in FIG. 7, after the write circuit 101 charges, to the voltage Vl, the non-selected bit lines and the plate lines in advance when all the word lines are 0 V at the beginning of the cycle, the power supply voltage VDD is applied to the word line WL1, which turns on the transistor T22. Then, the pulse which has the pulse width tp and whose voltage changes from Vl through 0 to Vl is applied to the selected bit line, and a threshold voltage for low resistance writing (Vl) in the case of writing the data "1" into the memory cell M222 is applied accordingly. As a result, a variable resistance layer of the memory cell M222 changes to the low resistance state (LR writing). In other words, the data "1" is written into the memory cell M222. It is to be noted that, at the end of the cycle after the selection transistor T22 is turned off by reducing, to 0 V, the power supply voltage VDD applied to the word line, each line which is charged to the voltage V1 is discharged to 0 V. The bottom right corner of FIG. 7 shows, as "Voltage application condition B", a schematic diagram showing an application condition in the cycle, and it is clear that a current flows from the first electrode layer toward the second electrode layer.

In a read cycle for the memory cell M211, as shown by "Access to M211 Read '0'" in FIG. 7, a predetermined voltage is applied to the word line WL0 so that the transistor T11 is turned on. Moreover, the column selection circuit 304 connects the memory cell M211 to the sense amplifier 102, and applies, to the bit line BL0, the read voltage Vref1 which has a smaller amplitude than the pulse at the time of writing and thus does not cause a resistance change of the memory cell, according to the timing of the connection. As previously mentioned, after the read voltage Vref1 is applied for a predetermined period of time, the bit line BL0 is discharged with a time constant determined by the resistance value of the memory cell M211 connected in parallel to the capacitor 137 in the sense amplifier 102. It takes a long time to perform the discharge because the previous writing has set the memory cell M211 to HR, and the comparator 135 outputs the data "0" because the counter 134 is counted up to a value larger than a Ref counter value held in the Ref counter value holding circuit 133 in the sense amplifier 102 shown in FIG. 4.

Next, in a read cycle for the memory cell M222, as shown by "Access to M222 Write '0'" in FIG. 7, the same voltage as the voltage applied in the read cycle for the memory cell M211 is applied to the word line WL1. Moreover, the column selection circuit 304 connects the memory cell M222 to the sense amplifier 102, and applies, to the bit line BL1, the read voltage Vref1 according to the timing of the connection. After the read voltage Vref1 is applied for a predetermined period of time, the bit line BL1 is discharged with a time constant determined by the resistance value of the memory cell 222 connected in parallel to the capacitor 137 in the sense amplifier 102. It takes a short time to complete the discharging because the previous writing has set the memory cell M222, and the comparator 135 outputs the data "1" because the counter 134 is counted only up to a value smaller than a Ref counter value held in the Ref counter value holding circuit 133 in the sense amplifier 102 shown in FIG. 4. It goes without saying that in these read cycles, the write circuit 101 supplies 0 V (ground level) to all the plate lines and non-selected bit lines.

The following continuously describes verify additional writing to be performed so that the nonvolatile storage device 300 according to an implementation of the present invention achieves high reliability. Generally, in the case of restoring binary digital data that is stored, it is judged whether the data indicates "1" or "0" by determining whether a physical quantity detected by the sense amplifier 102 is greater or less than a predetermined threshold value. As shown in FIG. 5, the sense amplifier 102 shown in FIG. 4 judges whether the stored data indicates "1" or "0" by determining whether a time (the number of counts) for discharging, via the memory cell, the potential applied to the memory cell is greater or less than the threshold value of "20". However, a resistance value used for data storage deteriorates due to stress such as a shelf test, a repeated data reading test, and a high-temperature storage shelf test, which reduces reliability of stored data. The verify additional writing refers to controlling a resistance value to be written, checking whether a value to which a predetermined margin is added exceeds, for example, the threshold value of "20", and performing rewriting when the value does not exceed the threshold value so that data reliability in a predetermined environment is ensured in anticipation of such a deterioration factor.

Figure 8:
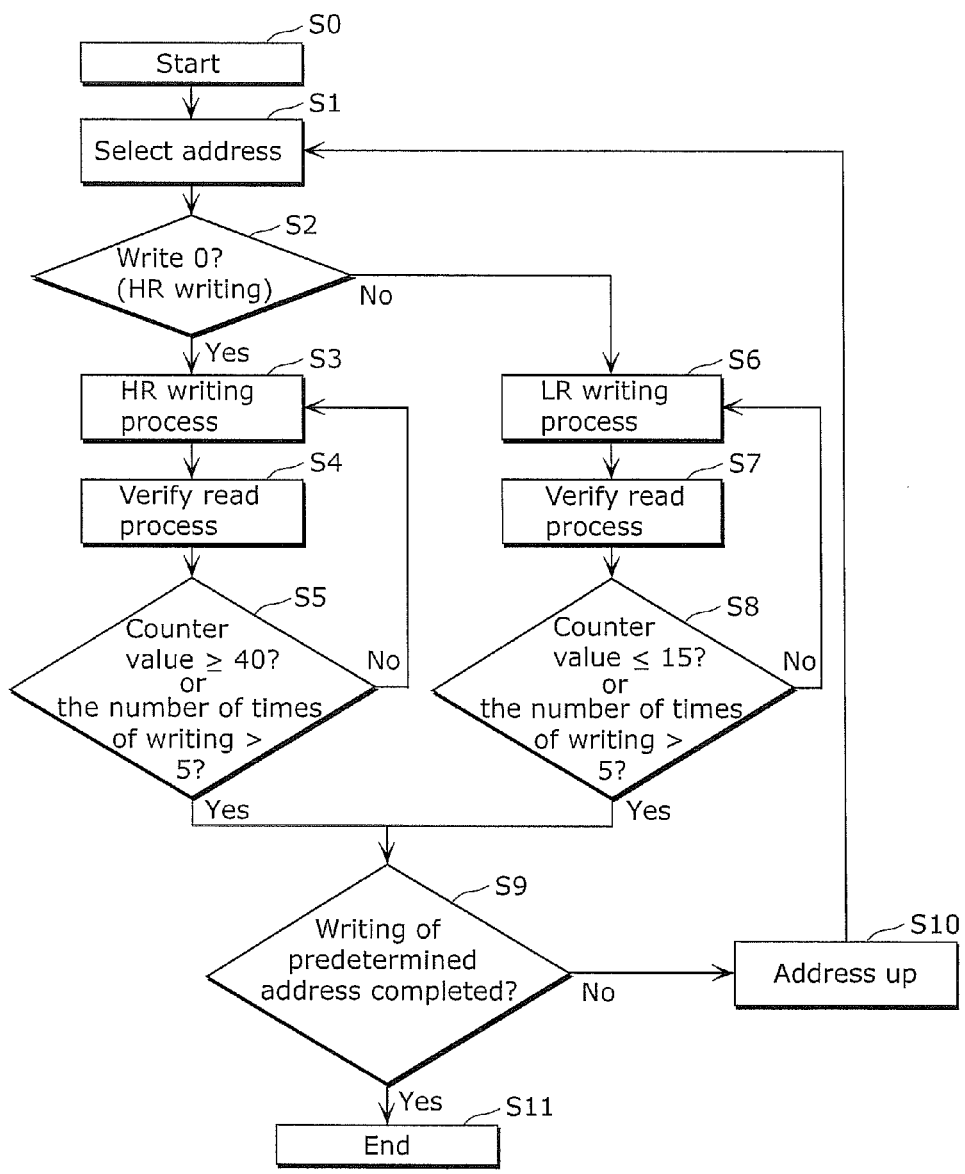
[FIG. 8]

FIG. 8 shows a specific example of a verify additional writing flow according to this embodiment. In FIG. 8, when the flow starts (S0), a memory cell having an initial address in an address space into which data is written is selected as illustrated in FIG. 6 (S1). Then, in the case of writing the data "0" (Yes in S2), an HR writing process is performed (S3), and in the case of writing the data "1" (No in S2), an LR writing process is performed (S6). Next, the selected memory cell is connected to the sense amplifier 102, a verify read process is performed on the memory cell, and the controller 103 obtains a counter value corresponding to a resistance value of the memory cell (S4 or S7). A write operation is repeated until the value becomes equal to or above "40" in the HR writing process or the value becomes equal to or below "15" in the LR writing process (No in S5 or S8). In this regard, however, the write operation is endlessly repeated when the memory cell malfunctions, and thus an upper limit for the number of times of additional writing is set to 5 times. When the counter value exceeds a desired value (Yes in S5 or S8), a write process for the next address is started (S10) if the next address is present (No in S9), and the flow ends (S11) if the next address is absent (Yes in S9). Such a flow sets the counter value to be equal to or above "40" in the HR writing process or to be equal to or below "15" in the LR writing process, and thus allows writing for which the predetermined margin is secured relative to the threshold value of "20". It is to be noted that when a single verify operation for the same memory cell does not satisfy the conditions, it is effective to take measures such as changing a write pulse width and gradually increasing a write voltage, each time the verify operation is repeated.

Each of (a) and (b) in FIG. 9 shows a graph having the horizontal axis indicating an address value and the vertical axis indicating a counter value at the time when a memory cell having the address value changes to HR or LR. (a) in FIG. 9 shows a case of single writing without performing a verify additional writing process, and (b) in FIG. 9 shows a case of performing the verify additional writing process shown by the flow in FIG. 8. As is obvious from (a) and (b) in FIG. 9, although writing errors occur in (a) in FIG. 9, in (b) in FIG. 9, it is possible to verify that a distinct window is open from the counter value of "15" to the counter value of "40", and it is clear that data writing for which a desired detection margin is secured and has high reliability is performed.

Figure 10:
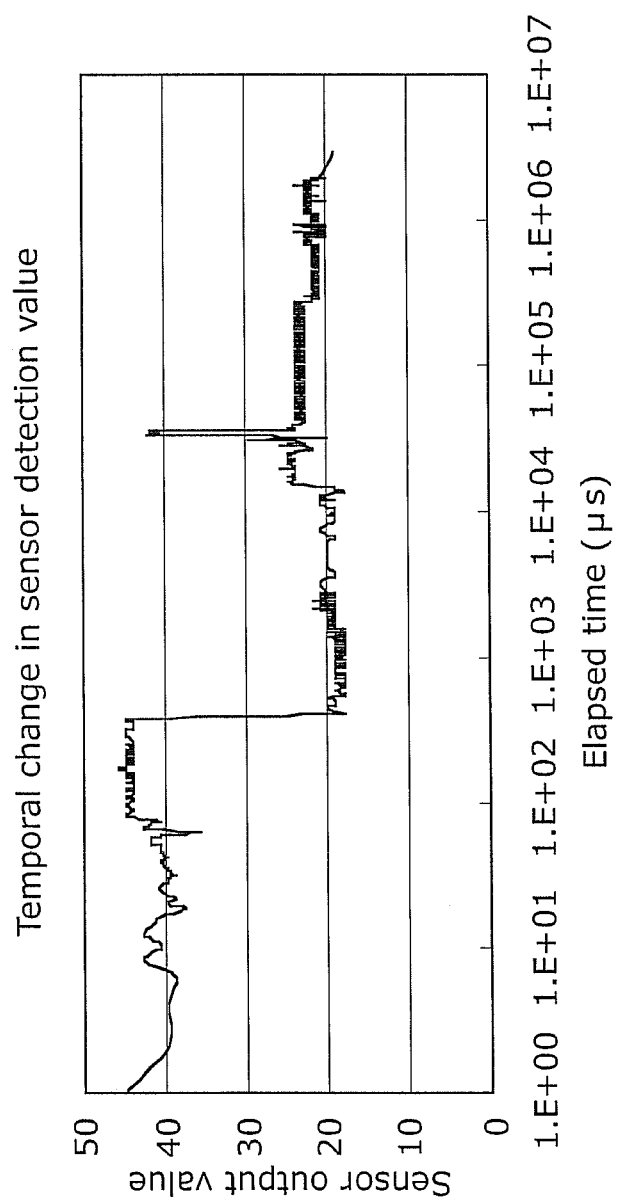
[FIG. 10]

The inventor has discovered a very significant issue in the above nonvolatile storage device 300 which has increased the reliability. The issues is described with reference to FIG. 10. FIG. 10 has a horizontal axis indicating an elapsed time since the end of writing into a memory cell, and a vertical axis indicating a counter value (sensor output value) which is obtained by repeatedly reading, for each 2 μs, the written memory cell and is outputted as the output B shown in FIG. 4. To put it differently, the vertical axis indicates a value corresponding to a resistance value of a selected memory cell, and shows that the larger a counter value is, the higher resistance is, and the lower a counter value is, the lower resistance is. An elapsed time after a high resistance (HR) writing process is performed on the memory cell is shown. As seen in FIG. 10, a sensor output value immediately after writing (elapsed time of 1 μs) is "45" and exceeds a verify point of "40", and it is clear that desired writing has been achieved. However, a resistance value varies as time elapses subsequently. In particular, when 500 μs passes, the resistance value rapidly varies and the memory cell changes to the low resistance state (LR). As a result, the sensor output value is reduced to between "19"

and "20" inclusive. In a conventional writing method, in a memory cell array including memory cells each having 256 k bits, 0.1% to several percentage of the memory cells are a memory cell which deteriorates beyond a predetermined verify point as a resistance value varies after the initial writing by which the verify point is exceeded. NPL 1 discloses that a resistance change of a variable resistance element is caused by oxidation-reduction reaction in a variable resistance layer in a neighborhood of an electrode interface, and in view of a mechanism of the resistance change, the inventor has estimated the above phenomenon as follows.

[Estimated Cause of Rapid Deterioration of Resistance Value]

The inventor has assumed that the resistance change phenomenon caused by the oxidation-reduction reaction occurring in the neighborhood of the electrode interface does not evenly occur in an entire neighborhood of an interfacial boundary between the electrode and the variable resistance layer, and the oxidation-reduction reaction is locally concentrated. Based on this assumption, when the resistance value of the variable resistance element varies, an area extremely vulnerable to stress is formed. For instance, in the case of HR writing (oxidation), an insufficient oxidation area is formed in the neighborhood of the interfacial boundary between the electrode and the variable resistance layer, and in the case of LR writing (reaction), an insufficient area is formed in the same. This leads to low activation energy in the local area. For this reason, it is considered that a phenomenon such as deterioration of a resistance value caused by a read voltage lower than a voltage at the time of writing and a change of a resistance value caused by short-time shelf test occurs.

Based on such an assumption, a problem-solving method for the phenomenon is intended to eliminate the local concentration of the oxidation-reduction, and to cause the oxidation-reduction reaction to evenly occur in the neighborhood of the interfacial boundary between the electrode and the variable resistance layer. Stated differently, even when the local area vulnerable to stress is formed, it is sufficient to correct the defective area through some sort of rewriting. For example, assuming that a pulse of a positive polarity voltage (Vh) necessary for normal HR writing is an HR pulse, and a pulse of a negative polarity voltage (Vl) necessary for normal LR writing is an LR pulse, the HR writing is first considered below.

It is assumed that a locally HR-defective area in which the HR writing (oxidation) is insufficient even when the memory cell changes to the high resistance state after the HR pulse for HR writing is applied to the memory cell is formed. Based on the assumption, the LR writing is performed on the HR-defective area by only applying, to the HR-defective area, a negative polarity pulse (hereafter referred to "a reverse polarity pulse for HR change") of a voltage (e.g. ½Vl) smaller than the LR pulse. However, normal areas other than the HR-defective area are in a desired oxidation state, and thus a low-level reverse polarity pulse for HR change does not cause the sufficient LR writing. As stated above, it can be expected that the LR writing is selectively performed on only the HR-defective area, then rewriting is intensively performed on only the HR-defective area, on which the LR writing is performed, when the HR pulse is applied again to the HR-defective area, and all the areas are homogenized to normal writing areas.

Likewise, it is also assumed that a locally LR-defective area in which the LR writing (reaction) is insufficient even when the memory cell changes to the low resistance state after the LR pulse for LR writing is applied to the memory cell is formed. Based on the assumption, the HR writing is performed on the LR-defective area by only applying, to the LR-defective area, a positive polarity pulse (hereafter referred to "a reverse polarity pulse for LR change") of a voltage (e.g. ½ Vh) smaller than the HR pulse. However, normal areas other than the LR-defective area are in a desired reaction state, and thus a low-level reverse polarity pulse for LR change does not cause the sufficient HR writing. As stated above, it can be expected that the HR writing is selectively performed on only the LR-defective area, then rewriting is intensively performed on only the LR-defective area, on which the LR writing is performed, when the LR pulse is applied again to the LR-defective area, and all the areas are homogenized to normal writing areas.

The following experiments are conducted based on the above expectations.

EXPERIMENT EXAMPLE 1

First, the following describes examples of a writing method according to Embodiment 1 of the present invention with reference to (a) and (b) in FIG. 11. Similar to the examples shown in FIG. 7, described is an example of writing into the memory cell M211 in the memory cell array shown in FIG. 6. (a) in FIG. 11 shows a writing method by which the memory cell changes to the high resistance state (HR), and (b) in FIG. 11 shows a writing method by which the memory cell changes to the low resistance state (LR). It is clear from (a) and (b) in FIG. 11 that a single write cycle is performed in three steps. Moreover, (a) and (b) in FIG. 11 show "Difference in potential between both ends of M211", a waveform of the difference is a waveform at the time when a potential of a plate line is 0 V so that a direction of voltage application which is indicated by the arrow 108 in FIG. 1 and in which a current flows can be represented as positive polarity application with respect to the memory cell. It is clear from (a) in FIG. 11 that in an HR writing method, an HR pulse having normal voltage Vh is applied in "the first step", a reverse polarity pulse for HR change voltage (VlLow) having magnitude less than a normal LR pulse (magnitude of Vl) is applied in "the second step", and further the HR pulse having the voltage Vh is applied again in "the third step". Furthermore, it is clear from (b) in FIG. 11 that in an LR writing method, an LR pulse having normal voltage Vl is applied in "the first step", a reverse polarity pulse for LR change voltage (VhLow) having magnitude less than a normal HR pulse (magnitude of Vh) is applied in "the second step", and further the LR pulse having the voltage Vl is applied again in "the third step". The writing methods shown in (a) and (b) in FIG. 11 make it possible to selectively reset a defective area formed when the writing is temporarily performed, and to perform rewriting again.

Figure 12:
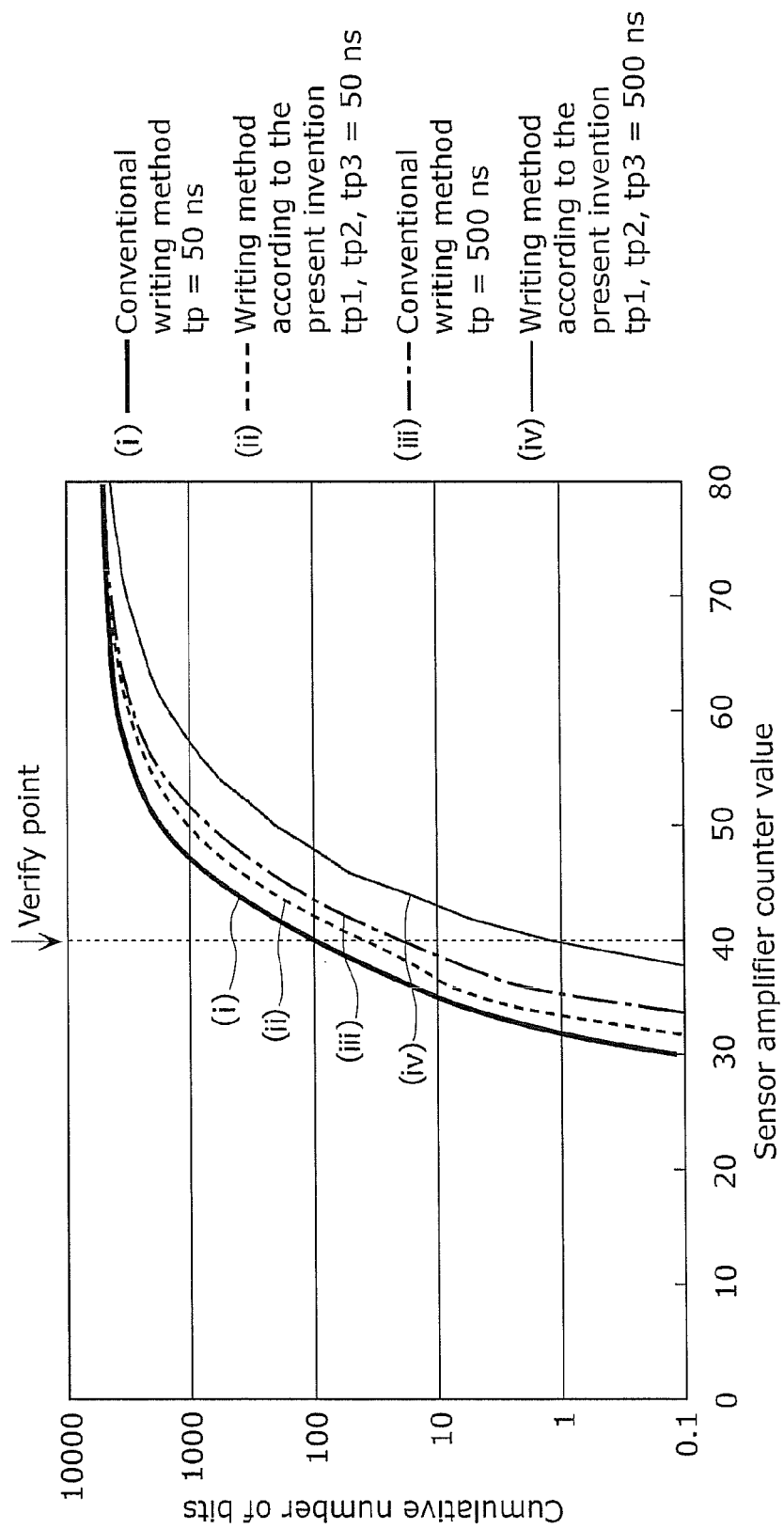
[FIG. 12]

Next, the following describes a result of an experiment of actually comparing the new writing method with the conventional writing method. Specifically, the number of failed bits at the time when the pulse width tp in FIG. 7 is replaced with 50 ns and 500 ns and two types of HR writing are performed in the conventional writing method and the number of failed bits at the time when pulse widths tp1, tp2, tp3 in (a) and (b) in FIG. 11 are replaced with 50 ns and 500 ns and two types of HR writing are performed in the new writing method according to an implementation of the present invention are measured and compared. FIG. 12 shows a result of the measurements. In FIG. 12, the horizontal axis indicates a counter value output as the output B of the sense amplifier in FIG. 4 at the time when reading is performed after writing is performed on each of memory cells. The vertical axis indicates a cumulative number of bits below each of counter values. The vertical broken line in FIG. 12 shows a line of "40" that is a verify point at the time of the HR writing. The thick solid line (i) in FIG. 12 shows a bit distribution at the time when the write pulse width (tp) is 50 ns and pulse magnitude (Vh) is 2.4 V in the conventional writing method. The broken line (ii) in FIG. 12 shows a bit distribution at the time when the write pulse widths (tp1, tp2, tp3) are 50 ns, pulse magnitude (Vh) is 2.4 V, and pulse magnitude (VlLow) is 1.2 V in the writing method according to an implementation of the present invention. The dashed line (iii) in FIG. 12 shows a bit distribution at the time when the write pulse width (tp) is 500 ns and pulse magnitude (Vh) is 2.4 V in the conventional writing method. The thin solid line (iv) in FIG. 12 shows a bit distribution at the time when the write pulse widths (tp1, tp2, tp3) are 500 ns, pulse magnitude (Vh) is 2.4 V, and pulse magnitude (VlLow) is 1.2 V in the writing method according to an implementation of the present invention. It is clear from the four lines shown in FIG. 12 that the number of bits below the verify point is more reduced under the same pulse width condition by the writing method according to an implementation of the present invention. Approximately 100 failed bits under the conventional writing condition of the pulse width of 50 ns are reduced to approximately 40 failed bits under the writing condition of the present invention, and 20 failed bits under the conventional writing condition of the pulse width of 500 ns are reduced to nearly zero under the writing condition of the present invention. Although, as stated above, the conventional writing condition makes it possible to reduce the number of the failed bits by increasing the pulse width, application of the reverse polarity voltage pulse for HR change of the present invention produces further reduction effects.

It is to be noted that to ensure fairness in the comparative experiment, in the conventional writing condition for (i) and (iii) in FIG. 12, the number of writing processes is three, and a total period of time of writing into a memory cell is the same as in (ii) and (iv) to be compared. In other words, when the writing process is performed on the memory cell for the same period of time, it is clear that the writing method according to an implementation of the present invention reduces the number of the failed bits more.

As described above, it is verified that, in the HR writing, the memory cell changes to the low resistance state in a short time after writing performed by the writing method according to an implementation of the present invention shown in (a) in FIG. 11, and a deterioration phenomenon that exceeds the verify point can be improved. It is also simultaneously verified that, in the LR writing, the memory cell changes to the high resistance state in a short time after writing performed by the writing method shown in (b) in FIG. 11, and a reverse deterioration phenomenon that exceeds the verify point can be improved.

<Modifications>

The following describes modifications of the writing method according to an implementation of the present invention. The most basic pattern of writing is the writing performed in the three steps shown in (a) and (b) in FIG. 11, but various patterns can be conceived by combining a pulse width, a voltage magnitude value of the reverse application performed in the second step, and so on. To put it differently, for the pulse magnitude and the pulse width in the first step shown in (a) and (b) in FIG. 11, there are three conditions that the pulse width in the second step is "larger, smaller, or the same" and six conditions that the pulse magnitude in the third step is "greater, less, or the same" and the pulse width in the third step is "larger, smaller, or the same". Thus, there are 1×3×6=18 ways of combining these for each of the HR writing and the LR writing.

Figure 13:
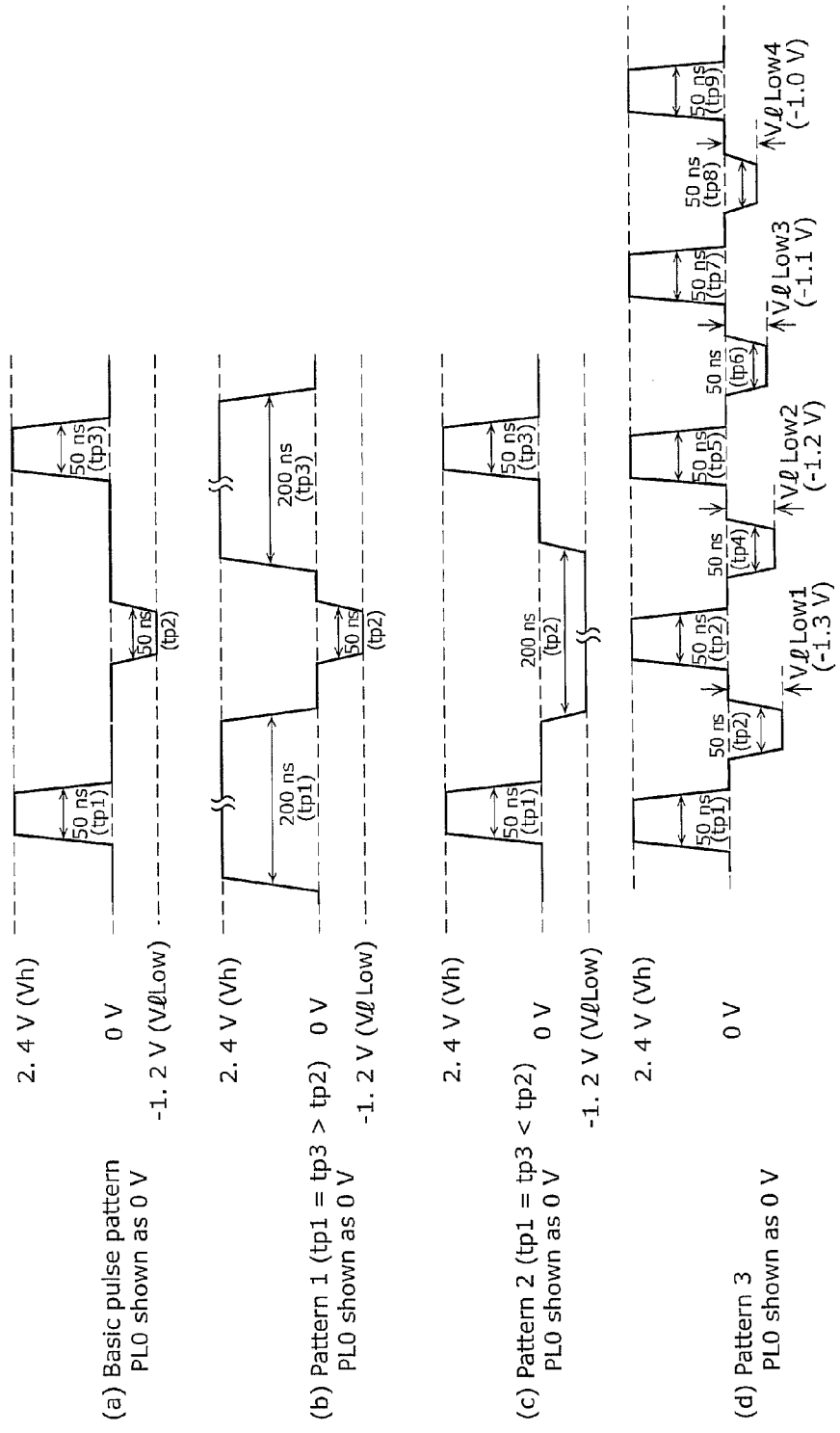
[FIG. 13]
Each of (a) to (d) in FIG. 13 is a timing diagram showing a modification of one of the writing methods in the nonvolatile storage device according to Embodiment 1 of the present invention.

Among the modifications considered by the inventor, patterns which have produced a better improvement effect than the basic pattern are shown in (a) to (d) in FIG. 13. It is to be noted that each of the patterns shown in (a) to (d) in FIG. 13 is shown in waveform by the same method as the illustration of "Difference in potential between both ends of M211" in (a) and (b) in FIG. 11. A method for applying to an actual word line, bit line, and plate line follows the example shown in (a) and (b) in FIG. 11. Moreover, FIG. 13 shows only an HR write cycle, and an LR write cycle is omitted as being easily inferred because application is performed in the track of the example of (b) in FIG. 11 so that the waveform of "Difference in potential between both ends of M211" is turned upside down.

(a) in FIG. 13 shows the standard basic pattern according to an implementation of the present invention, and is the same as what is shown in (a) in FIG. 11. In other words, in the case of the HR writing, one cycle of a write process is completed when a pulse having a positive polarity that is a write direction and a normal magnitude level Vh (e.g. 2.4 V) is applied in the first step, a pulse having a negative polarity that is a reverse write direction and VlLow (e.g. −1.2 V) that is lower than the normal magnitude level Vl (e.g. −2.4 V) is applied in the second step, and the pulse having the positive polarity and the magnitude level Vh (2.4 V) is applied in the third step. Here, the pulse width in each step is uniformly 50 ns.

In the light of the basic pattern, a pattern 1 shown in (b) in FIG. 13 is described below. The pattern 1 shown in (b) in FIG. 13 differs from the basic pattern in that the pulse width in each of the first and third steps is larger than that in the second step. (b) in FIG. 13 illustrates that the pulse width tp1 and the pulse width tp3 are 200 ns, and the pulse width tp2 is 50 ns. Next, a pattern 2 shown in (c) in FIG. 13 is described. The pattern 2 shown in (c) in FIG. 13 differs from the basic pattern in that the pulse width in the second step is larger than that in each of the first and third steps. (c) in FIG. 13 illustrates that the pulse width tp1 and the pulse width tp3 are 50 ns, and the pulse width tp2 is 200 ns. Further, a pattern 3 shown in (d) in FIG. 13 is described. The pattern 3 in (d) in FIG. 13 differs from the basic pattern in that the number of steps has increased from 3 steps to 9 steps, and a magnitude level of a reverse write pulse applied in each even step gradually decreases. (d) in FIG. 13 shows, as the magnitude level of the reverse write pulse, VlLow1 (−1.3 V), VlLow2 (−1.2 V), VlLow3 (−1.1 V), and VlLow4 (−1.0 V). It is to be noted that although (a) to (d) in FIG. 13 clearly show the specific voltages and pulse widths, these values facilitate comparison with the above experimental result shown in FIG. 12, and the present invention is not limited to the values. In particular, the number of the steps in the pattern 3, an amount of change at the time when the magnitude level of VlLow gradually decreases, and values of a start magnitude level and an end magnitude level of VlLow are varied depending on the performance of memory cells or demand performance of nonvolatile storage devices.

Figure 14:
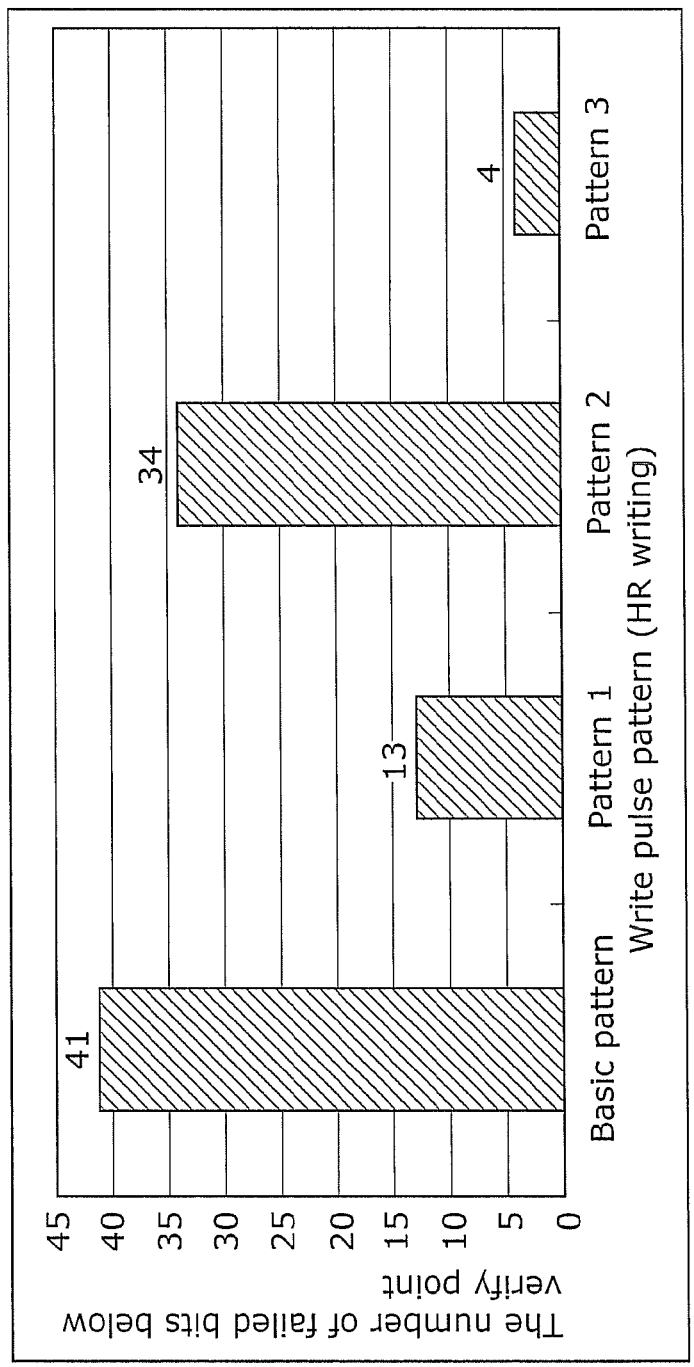
[FIG. 14]

FIG. 14 shows a result of the experiment of the writing methods in which each pattern shown in one of (a) to (d) in FIG. 13 is applied to the flow shown in FIG. 8. In FIG. 14, the vertical axis indicates the number of failed bits below a verify point, that is, the number of failed bits in each writing method. Approximately 100 failed bits among 5 k bits at the time when the writing method according to an implementation of the present invention is not performed are reduced to 41 failed bits by the basic pattern writing shown in (a) in FIG. 13. This is as shown in FIG. 12. Further, the patterns 2, 1, and 3 reduce them to 34 failed bits, 13 failed bits, and 4 failed bits, respectively. Produced is a substantially similar improvement effect to the improvement effect obtained when the pulse width is set to 500 ns as explained in FIG. 12. Assuming that a period of time necessary for switching between the positive polarity pulse and the negative polarity pulse is, for instance, 10 ns, it takes 1530 ns to complete one write cycle in the basic pattern in which the pulse width (tp) is 500 ns, whereas it takes 540 ns to complete the cycle in the pattern 3. Stated differently, a write operation having a shorter cycle produces the same improvement effect, which is further favorable to a nonvolatile semiconductor device for which a data writing and transfer speed is required. It is expected that in the pattern 3, the first and second steps are repeated while gradually decreasing the magnitude level of the reverse write pulse in the second step, writing into only the locally HR-defective area in which oxidation (HR writing) is insufficient is repeated in the variable resistance element without influencing the local normal areas in which oxidation (HR writing) is sufficient, and thus the failed bits are gradually reduced.

It is to be noted that each pulse width or pulse voltage differs depending on manufacturing conditions for samples, a cell size, and so on, and thus is optimally selected according to the manufacturing conditions, the cell size, and so on, and that, concurrently, a write pattern which reduces the failed bits most is appropriately selected. It is preferred that, from a standpoint of the characteristic of the variable resistance element shown in FIG. 3, especially the voltage VhLow or voltage VlLow be a voltage near or slightly higher or lower than a voltage with which a resistance change starts. In particular, in the pattern 3, a voltage value which causes the voltage VlLow to gradually decrease is selected from 1.3 V to 1.0 V when the voltage value is set to be near 1.1 V with which the LR writing starts, which results in reducing the fails bits most. This is because it is considered that the characteristic of each cell in the memory cell array slightly varies from the characteristic shown in FIG. 3, and optimal voltages differ.

It is to be noted that (a) to (d) in FIG. 13 and FIG. 14 show the experimental example of the HR writing, and an experimental result showing the same tendency is obtained for the LR writing. More specifically, in the LR writing, a basic pattern and patterns 1 to 3 correspond to the basic pattern and patterns 1 to 3 in which polarities of the waveforms in (a) to (d) in FIG. 13 are reversed, and the pattern 3, the pattern 1, the pattern 2, and the basic pattern are ranked in descending order of the effect of reducing the number of failed bits.

Figure 15:
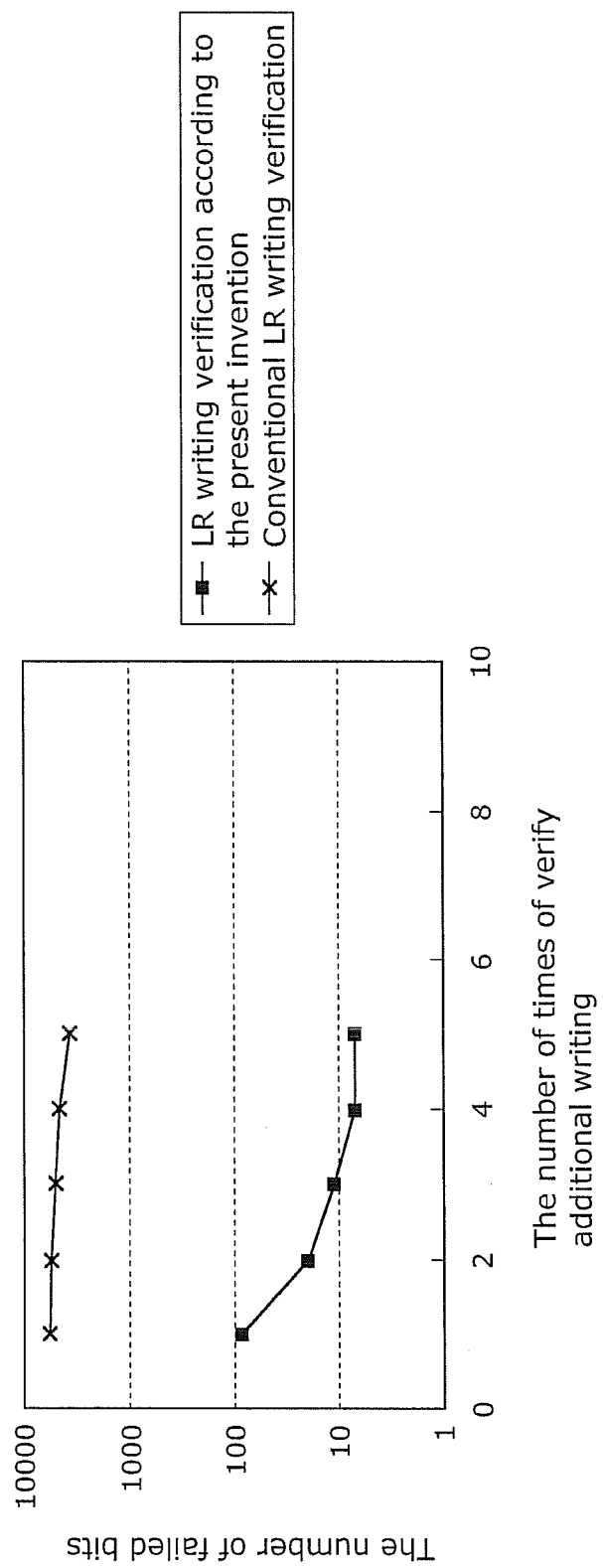
[FIG. 15]

FIG. 15 is a graph showing an effect of LR writing according to an implementation of the present invention. Here, plotted is a transition of the number of failed bits in the case of repeating verify additional writing (LR writing accompanying verify) into a memory cell having 256K bits. In FIG. 15, the horizontal axis indicates the number of times of verify additional writing, and the vertical axis indicates the number of failed bits. A line (indicated by cross marks) for "Conventional LR writing verification" shows an experimental result of the conventional LR writing (that is, a method for applying, only one time, a pulse of a voltage Vl having a negative polarity in single LR writing), and a line (indicated by black rectangles) for "LR writing verification according to an implementation of the present invention" shows an experimental result of the LR writing according to an implementation of the present invention (that is, a method of applying, in single LR writing, a pulse of a voltage Vl having a negative polarity, a pulse of a voltage VhLow having a positive polarity, and the pulse of the voltage Vl having the negative polarity in this order).

As is clear from FIG. 15, the LR writing verify method according to an implementation of the present invention reduces the number of the failed bits more than the conventional LR writing verify method. Moreover, while the number of the failed bits hardly changes even by repeating the verify additional writing in the conventional method, the number of the failed bits is significantly reduced by repeating the verify additional writing in the method according to an implementation of the present invention.

The following can be derived from the effect of the HR writing verify according to an implementation of the present invention shown in FIG. 14 and the effect of the LR writing verify according to an implementation of the present invention.

In the case where a variable resistance element has a property of changing from a first resistance state (LR or HR) to a second resistance state (HR or LR) when a pulse of a first voltage (a threshold voltage for high resistance writing Vh or threshold voltage for low resistance writing Vl) is applied to the variable resistance element, and changing from the second resistance state (HR or LR) to the first resistance state (LR or HR) when a pulse of a second voltage (Vl or Vh) having a polarity different from a polarity of the first voltage (Vh or Vl) is applied to the variable resistance element, the first resistance state being a state in which first data ("1" or "0") is stored and the second resistance state being a state in which second data ("0" or "1") is stored, the following writing methods are effective.

When a memory cell (more strictly speaking, variable resistance element) is caused to change from the LR state, an example of the first resistance state, to the HR state, an example of the second resistance state, a basic pattern writing method reduces the number of failed bits more than the conventional writing method, the basic pattern writing method including: at least the first step of applying a positive pulse of a first voltage (Vh) to the variable resistance element; the second step of subsequently applying, to the variable resistance element, a negative pulse of a third voltage (VlLow) having a smaller absolute value than that of a second voltage (Vl) and the same polarity as that of the second voltage (Vl); and the third step of further subsequently applying again the positive pulse of the first voltage (Vh) to the variable resistance element, as shown by a schematic diagram for the HR writing in (a) in FIG. 16. A mechanism expected at the time of the resistance change is as shown in the bottom part of (a) in FIG. 16. It is expected that although the variable resistance element changes to the HR state due to the application of the positive pulse in the first step, a locally HR-defective area in which oxidation (HR writing) is insufficient is formed, the negative pulse in the second step causes the LR writing to be performed only on the HR-defective area, the positive pulse in the third step causes rewriting to be intensively performed only on the HR-defective area on which the LR writing is performed, and all areas are homogenized to normal writing areas.

In contrast, when the memory cell (more strictly speaking, variable resistance element) is caused to change from the HR state, an example of the first resistance state, to the LR state, an example of the second resistance state, the basic pattern writing method reduces the number of failed bits more than the conventional writing method, the basic pattern writing method including: at least the first step of applying a negative pulse of a first voltage (Vl) to the variable resistance element; the second step of subsequently applying, to the variable resistance element, a positive pulse of a third voltage (VhLow) having a smaller absolute value than that of a second voltage (Vh) and the same polarity as that of the second voltage (Vh); and the third step of further subsequently applying again the positive pulse of the first voltage (Vl) to the variable resistance element, as shown by a schematic diagram for LR writing cycle in (b) in FIG. 16. A mechanism expected at the time of the resistance change is as shown in the bottom part of (b) in FIG. 16. It is expected that although the variable resistance element changes to the LR state due to the application of the negative pulse in the first step, a locally LR-defective area in which reaction (LR writing) is insufficient is formed, the positive pulse in the second step causes the HR writing to be performed only on the LR-defective area, the negative pulse in the third step causes rewriting to be intensively performed only on the LR-defective area on which the HR writing is performed, and all areas are homogenized to normal writing areas.

Furthermore, as a more effective writing method, a pattern 1 writing method in which a pulse width of the first voltage (Vh or Vl) is larger than that of the third voltage (VlLow or VhLow) or a pattern 2 writing method in which a pulse width of the first voltage (Vh or Vl) is larger than that of the third voltage (VlLow or VhLow) reduces the number of the failed bits more than the basic pattern writing method in which each voltage has the same pulse width (smaller pulse width).

Moreover, as another effective writing method, a pattern 3 writing method in which a pulse of the first voltage (Vh or Vl) is applied at least one time after application of the pulse of the first voltage (Vh or Vl) and application of a pulse of the third voltage (VlLow or VhLow) are repeated N (an integer equal to or larger than 2) times reduces the number of the failed bits further. Here, it is preferred that the number of repetitions increase with a decrease in the third voltage (VlLow or VhLow).

It goes without saying that each of the types of the writing methods shown in (a) to (d) in FIG. 13 is applicable to the verify writing shown in FIG. 8. A readout circuit (sense amplifier 102, data input and output circuit 307) performs a read process after the write circuit 101 performs, when the variable resistance element in the memory cell is caused to change from the first resistance state (LR or HR) to the second resistance state (HR or LR), at least (i) a first write process of applying the pulse of the first voltage to the variable resistance element and (ii) a second write process of applying the pulse of the third voltage and the pulse of the first voltage to the variable resistance element in this order. Then, the control circuit 310 controls the write circuit 101 and the readout circuit so that the second write process and the read process are repeated until the variable resistance element has a desired resistance value (resistance value in the HR state or resistance value in the LR state) (S3 to S5 and S6 to S8 in FIG. 8). With this, it is possible to achieve secure verify writing.

As stated above, in the case where the variable resistance element has a property of changing from the first resistance state to the second resistance state when the pulse of the first voltage is applied to the variable resistance element, and changing from the second resistance state to the first resistance state when the pulse of the second voltage having a different polarity from that of the first voltage is applied to the variable resistance element, the first resistance state being the state in which the first data is stored and the second resistance state being the state in which the second data is stored, it is clear that stable writing is achieved by applying, to the variable resistance element, (i) the pulse of the first voltage, (ii) the pulse of the third voltage having a smaller absolute value than that of the second voltage and the same polarity as that of the second voltage, and (iii) the pulse of the first voltage in this order, when the variable resistance element is caused to change from the first resistance state to the second resistance state.

Although, as already stated above with reference to FIG. 3, it is preferred that the optimal value of the third voltage be near or slightly higher or lower than the voltage with which the resistance change starts, a magnitude of the third voltage is considered in more detail here. FIG. 17 shows a resistance change characteristic, which is different from the characteristic shown in FIG. 3, at the time when a pulse of each voltage is applied to a series path including selected one memory cell. It is to be noted that a resistance value is calculated using a current value of a direct current flowing when a read voltage of 0.4 V is applied to both ends of the series path including the memory cell in the same manner as in FIG. 3. Furthermore, the reason why different data of the memory cell from the data in FIG. 3 is used is that a memory cell including a measurement path for measuring a pulse current which is described later is selected. FIG. 18 is a graph showing an amplitude value of a pulse current flowing through a series path including a memory cell when a pulse of each voltage is applied to the selected memory cell.

An upper limit of the absolute value of the third voltage needs to be smaller than the absolute value of the second voltage so that an immediately previous resistance state of a variable resistance element is not completely reversed. In contrast, a read voltage which is to be applied to the variable resistance element so as to read a current resistance state of the variable resistance element is a voltage value which does not change the resistance state of the variable resistance element even when the read voltage is applied to the variable resistance element many times. To put it differently, a lower limit of the absolute value of the third voltage is at least greater than the read voltage. Furthermore, as stated in the explanation of the mechanism with reference to (a) and (b) in FIG. 16, it is preferred that the third voltage be equal to or greater than a voltage necessary for changing the resistance state in a reverse direction at least in part of the variable resistance element. For example, assuming a case where writing is performed to cause the variable resistance element shown in FIG. 3 to change from the low resistance state to the high resistance state, it is preferred that the third voltage be a voltage that is (i) lower than a voltage (e.g. 2.4 V) which completely reverses the immediately previous resistance state (e.g. low resistance state) of the variable resistance element and (ii) equal to or higher than a voltage (e.g. 1.0 V) necessary for causing the resistance state of the variable resistance element to start reversing. A similar transition is also observed in FIG. 17. When the variable resistance element changes from the low resistance state to the high resistance state, associating conditions for the third voltage with an amount of change of a resistance value facilitates understanding. For instance, in FIG. 3, the resistance value of the low resistance state is 10.2 kΩ when 0.9 V is applied. The resistance value is varied by 5% to 10.7 kΩ when 1.0 V is applied, and is varied by 15% to 11.8 kΩ when 1.1 V is applied. Likewise, in FIG. 17, the resistance value of the low resistance state is 11.9 kΩ when 0.9 V is applied. The resistance value is varied by 9% to 13 kΩ when 1.0 V is applied, and is varied by 29% to 15.4 kΩ when 1.1 V is applied. The amount of change of the resistance value is from approximately 10 kΩ of the low resistance state to approximately 100 kΩ of the high resistance state, and thus a range of the resistance change from the low resistance state to the high resistance state is approximately 90 kΩ. In FIG. 3, a voltage which causes the resistance value to surely exceed 45 kΩ, the half of the range of the resistance change, (voltage which causes the resistance value to temporarily decrease but to exceed 45 kΩ) is indicated by a point where an applied voltage reaches 1.8 V.

Similarly, in FIG. 17, a voltage which causes the resistance value to surely exceed 45 kΩ, the half of the range of the resistance change, (voltage which causes the resistance value to temporarily decrease but to exceed 45 kΩ) is indicated by a point where an applied voltage reaches 1.6 V. Selecting these voltage values as the third voltage value in the experiment for obtaining the data shown in FIG. 12 or FIG. 14 produces no effect. As a result, as the conditions for the third voltage at the time when the resistance state is changed from the low resistance state to the high resistance state, the lower limit of the third voltage is a voltage which changes the resistance value by at least 5% or more, and the upper limit of the third voltage is equal to or below a voltage necessary for surely changing ½ of a predetermined range of the resistance change.

Next, a case of changing from the high resistance state to the low resistance state is considered. For example, assuming a case where writing is performed to cause the variable resistance element shown in FIG. 3 to change from the high resistance state to the low resistance state, it is preferred that the third voltage be a voltage that is (i) lower than a voltage (e.g. 2.4 V as the absolute value) which completely reverses the immediately previous resistance state (e.g. high resistance state) of the variable resistance element and (ii) equal to or higher than a voltage (e.g. 1.1 V as the absolute value) necessary for causing the resistance state of the variable resistance element to start reversing. The following describes reasons for the above.

When the variable resistance element changes from the high resistance state to the low resistance state, associating conditions for the third voltage with an amount of change of a resistance value and a current value facilitates understanding. For instance, in FIG. 17, a resistance value of 140 kΩ at the time of application of −1.0 V changes to 13.7 kΩ after −1.1 V is applied. In connect with the above, in FIG. 18, a current of 25 µA flows through the variable resistance element when −1.0 V is applied, a current of 102 µA flows through the variable resistance element when −1.1 V is applied, and a current of 135 µA flows through the variable resistance element when −1.4 V is applied. It is clear that a current flowing through the variable resistance element is saturated at 150 µA when a voltage equal to or lower than −1.6 V (i.e. a negative voltage having an absolute value equal to or higher than that of 1.6 V) is applied. This is because of current control caused by load characteristics of a transistor (three-terminal selection element 107) connected in series to the variable resistance element 106, and the current does not significantly increase from 150 µA even when a voltage between both ends of the memory cell 105*a* reaches −2.4 V (not shown in FIG. 18). Selecting the applied voltage equal to or lower than −1.6 V (i.e. the negative voltage having the absolute value equal to or higher than that of 1.6 V) as the third voltage value in the experiment for obtaining the data shown in FIG. 15 produces no effect. In other words, when it is assumed that an amount of current flowing when −2.4 V corresponding to the second voltage is applied is 150 µA, a voltage which allows a current of 25 µA equivalent to approximately 17% of the amount of current to flow is −1.0 V, and a voltage which allows a current of 135 µA equivalent to approximately 90% of the amount of current to flow is −1.4 V. Thus, it is preferred that the absolute value of the third voltage be between 1.0 V and 1.4 V inclusive. As a result, as conditions for the absolute value of the third voltage at the time when the resistance state is changed from the high resistance state to the low resistance state, the lower limit of the absolute value is equal to or greater than an absolute value of the voltage which allows 17% of the amount of the current flowing when the second voltage is applied to flow, and the upper limit of the absolute value is equal to or less than an absolute value of the voltage which allows 90% or less of the amount of the current flowing when the second voltage is applied to flow.

Furthermore, as more convenient standard, the absolute value of the third voltage may be equal to or smaller than the absolute value (here 2.4 V) of the second voltage, and be substantially half of the absolute value (here 1.1 V) of the second voltage.

(Embodiment 2)

Continuously, the following describes Embodiment 2 of the present invention.

The writing method according to Embodiment 1 of the present invention changes the written resistance level, and thus significantly reduces the number of failed bits which change to LR when the HR writing process is performed, and to HR when the LR writing process is performed. However, the writing method according to Embodiment 1 of the present invention does not reduce, to 0, the number of bits below the written level, and such bits are infrequently generated. In such a case, as is clear from FIG. 10, there is a case where a certain time needs to elapse so that the resistance value changes (in the sample example in FIG. 10, it takes 500 µs to cause a failure phenomenon.). In other words, it is not possible to recognize the failure even by checking a level of data written prior to the change, and it is not possible to perform the verify additional writing. In order to solve such a problem, on top of the writing method according to Embodiment 1 of the present invention, it is possible to perform the verify read process (S4 and S7 in the flow in FIG. 8) after a predetermined time elapses after the HR writing process (S3 in the flow in FIG. 8) and the LR writing process (S6 in the flow in FIG. 8) are performed. However, performing, for each 1 bit, the processes on a high-capacity memory array significantly increases a processing time.

FIG. 19 is a block diagram illustrating an example of a nonvolatile storage device 300*a* according to Embodiment 2. Elements of the nonvolatile storage device 300*a* which have the same reference signs as the elements in FIG. 6 have the same functions as the elements in FIG. 6. FIG. 19 differs from FIG. 6 in that a write data buffer 500, a read data buffer 501, a mask circuit 502, and a data comparing circuit 503 are added. Moreover, a method for controlling the nonvolatile storage device 300*a* which is performed by the controller 103 differs from the method according to Embodiment 1, and thus is described later.

First, the following describes operations of the added circuits. The write data buffer 500 is a circuit which temporarily holds data items to be written into M (an integer equal to or larger than 2) memory cells in the memory cell array 302, that is, a buffer circuit which temporarily holds, in a predetermined unit, data items inputted from an external interface (not shown). Likewise, the read data buffer 501 is a circuit which temporarily holds data items read from M memory cells in the memory cell array 302, that is, a buffer circuit which temporarily holds, in a predetermined unit, data items read from the memory cell array 302.

The data comparing circuit 503 is a comparing circuit which compares the data items of the M memory cells in the write data buffer 500 with the data items of the M memory cells in the read data buffer 501, and judges whether or not they match each other. The mask circuit 502 switches whether or not to perform writing on each bit corresponding to one of addresses of the data items in the write data buffer 500, based on the comparison result of the data comparing circuit 503, that is, performs control so that the write circuit 101 performs writing only on a bit corresponding to an address of the data in the write data buffer 500 which is judged not to match the data in the read data buffer 500 based on the comparison result.

It is to be noted that although the example in FIG. 19 shows a configuration where the mask circuit 502 is provided on a path from the write data buffer 500 to the write circuit 101, the present invention is not limited to this. The point is to perform control as to whether or not to perform writing of each data item corresponding to one of the addresses of the write data buffer 500, based on the comparison result of the data comparing circuit 503, and thus the mask circuit 502 may be implemented as, for example, part of the function of the controller 103. In this case, the mask circuit 502 performs control as to whether or not to perform a write operation itself for each data item corresponding to one of the addresses.

It is to be noted that the control circuit 310 and the mask circuit 502 according to this embodiment constitute a control circuit which (i) controls: a selection circuit (row selection circuit and driver 303 and column selection circuit 304) and the write circuit 101 so that the data items held in the write data buffer are written into the corresponding M memory cells in the memory cell array 302; and the selection circuit (row selection circuit and driver 303 and column selection circuit 304) and a readout circuit (sense amplifier 102) so that the data items are read from the M memory cells in the memory cell array 302, and are held in the read data buffer 501, and (ii) performs control as to whether or not to rewrite again the data items held in the write data buffer 500 into the corresponding memory cells, based on a comparison result of the data comparing circuit 503. At the time of verify, based on an instruction (not shown) from the controller 103, a value of the Ref counter value holding circuit 133 in the sense amplifier 102 shown in FIG. 4 is set to an HR verify determination value (40 in the above example) when the HR writing is performed or an LR verify determination value (15 in the above example) when the LR writing is performed, and a signal of a resultant output A is inputted to the read data buffer 501.

Moreover, each of the write data buffer 500 and the read data buffer 501 may include at least two buffer areas, buffer areas A and B, and it may be configured to perform, alternately on the buffer areas A and B, writing, verify, and additional writing in a unit of a capacity of each of the buffer areas A and B of the write data buffer 500 or the read data buffer 501. The same applies to a case where there are 3 or more buffer areas. Each of the buffer areas of the write data buffer 500 has the same capacity as a corresponding one of the buffer areas of the read data buffer 501.

In the sample example shown in FIG. 10, it takes 500 μs from when the failure phenomenon occurs to when the failure phenomenon ends. For instance, when the pattern 3 is used, a writing time per memory cell is approximately 500 ns. Assuming that data inputted from the outside is simultaneously read or written in parallel through channels in the nonvolatile storage device, for example, a capacity of one buffer area per channel has the following relationship: time at which failure phenomenon ends (500 μs)/writing time per memory cell (500 ns)=buffer capacity (1000 bits). When the writing, verify, and additional writing are performed in a unit of 1000 bits or more, a time at which the first verify process is performed is always later than 500 μs in all the memory cells, and the above writing failure is always found. Thus, it is possible to surely remove the failed bits, and to provide the very highly reliable nonvolatile storage device 300a which sufficiently takes advantage of the high speed and high reliability of the variable resistance nonvolatile memories.

It is to be noted that although the block diagram of FIG. 19 shows one write data buffer 500 and one read data buffer 501, in order to continuously exchange input and output data via the external interface, the buffers may have a plurality of pages having a capacity equal to or greater than the above capacity, and sequentially switch between a page for the exchange via the external interface and a page for performing writing into or reading from the memory cell array 302. Furthermore, memory main portions 301 may be provided in blocks, and a necessary data transfer speed may be ensured by causing the memory main portions to operate in parallel.

As described above, according to this embodiment, the writing, verify, and additional writing are collectively performed in the unit of the capacity of the write data buffer 500, and thus the data writing is surely performed for the failed bits which, although the failed bits would be considered normal immediately after the writing when the writing, verify, and additional writing were performed in the unit of 1 bit, have a delay time that changes the written values due to the subsequent elapsed time.

Although the nonvolatile storage device and the method for writing into the same according to an implementation of the present invention have been described based on the embodiments, the modifications, and the experimental examples above, the present invention is not limited to the embodiments, the modifications, and the experimental examples. Modifications resulting from various modifications to the respective embodiments that can be conceived by those skilled in the art and modifications realized by arbitrarily combining the constituent elements of the respective embodiments without materially departing from the teachings of the present invention are intended to be included in the scope of the present invention.

For instance, although the writing method having 3 or more steps of applying the reverse polarity pulse for HR change and the reverse polarity pulse for LR change as shown in FIG. 13 is performed in both of the HR writing and the LR writing in Embodiment 1, it is not necessary to perform such a writing method having 3 or more steps of applying the reverse polarity pulse for HR change and the reverse polarity pulse for LR change in both of the HR writing and the LR writing, and the method may be performed only in the HR writing or the LR writing, according to an implementation of the present invention. It is likely that the failed bits occur only in the HR writing or the LR writing depending on a type of variable resistance element, and thus the method having 3 steps according to an implementation of the present invention may be performed, for such a type of variable resistance element, only in the HR writing or the LR writing in which the failed bits occur.

Moreover, the writing method of any one of the basic pattern, the pattern 1, the pattern 2, and the pattern 3 shown in FIG. 13 may be used in the HR writing and the LR writing, and the writing method of a different pattern may be used in each of the HR writing and the LR writing. The pattern may be appropriately selected in consideration of the characteristic of the variable resistance elements, a time allowable for writing, reliability required for writing, and so on.

[Industrial Applicability]

A nonvolatile storage device according to an implementation of the present invention is useful as a nonvolatile storage device which (i) has a memory cell array including a plurality of variable resistance elements which changes between resistance states based on electrical pulses each having a different polarity, and (ii) makes it possible to: prevent a written resistance value from changing, in a short time immediately after writing, to decrease a detection margin; increase a yield for fabricating the device or a design margin by increasing stability and reliability of a writing operation and by significantly improving a data detection margin to which a dispersion distribution is added in the memory cell array; and achieve reduction in product costs. The examples of such a nonvolatile storage device include a nonvolatile memory for a mobile device such as a cellular phone and a digital camera. Moreover, a method for writing into a nonvolatile storage device according to an implementation of the present invention is useful as a method for writing into a nonvolatile storage device which makes it possible to ensure stability of a writing operation or detection margin, and to increase reliability, the nonvolatile storage device having a memory cell array including a plurality of variable resistance elements which changes between resistance states based on electrical pulses each having a different polarity. The examples of such a method for writing include a method for writing into a nonvolatile memory for a mobile device such as a cellular phone and a digital camera.

[Reference Signs List]

100a, 100b, 300, 300a Nonvolatile storage device
101 Write circuit
102 Sense amplifier
103 Controller
104 Switch circuit
105a, 105b Memory cell
106 Variable resistance element
107 Three-terminal selection element
109 Gate voltage driver
110 Two-terminal selection element
122 (Semiconductor) Substrate
124 Lower electrode
126 Variable resistance layer
128 Upper electrode
130 Reference voltage generation circuit
131 Driver
132 Level comparator
133 Ref counter value holding circuit
134 Counter
135 Comparator
136 Switch circuit
137 Capacitor
301 Memory main portion
302 Memory cell array
303 Row selection circuit and driver
304 Column selection circuit
307 Data input and output circuit
308 Power source control circuit
309 Address input circuit
310 Control circuit
500 Write data buffer
501 Read data buffer
502 Mask circuit
503 Data comparing circuit
BL Bit line
PL Plate line
M Memory cell
Vh Threshold voltage for high resistance writing
Vl Threshold voltage for low resistance writing
VhLow Voltage having reverse polarity pulse for LR change
VlLow Voltage having reverse polarity pulse for HR change
WL Word line
LR Low resistance state
HR High resistance state

The invention claimed is:

1. A nonvolatile storage device comprising:
a variable resistance element which includes a first electrode, a second electrode, and a variable resistance layer provided between said first electrode and said second electrode;
a write circuit which writes data into said variable resistance element; and
a read circuit which obtains resistance value data of said variable resistance element;
wherein said variable resistance element has a property of changing from a first resistance state to a second resistance state when a pulse of a first voltage is applied to said variable resistance element, and changing from the second resistance state to the first resistance state when a pulse of a second voltage having a different polarity from a polarity of the first voltage is applied to said variable resistance element, the first resistance state being a state where first data is stored and the second resistance state being a state where second data is stored, and
said write circuit performs additional writing on said variable resistance element based on the resistance value data obtained by said read circuit, after a writing operation for applying the pulse of the first or second voltage to said variable resistance element, and
in the additional writing, when the pulse of the first voltage is applied to said variable resistance element in the writing operation, said write circuit applies, to said variable resistance element, at least a pulse of a third voltage and the pulse of the first voltage in this order, the third voltage having a smaller absolute value than an absolute value of the second voltage and a same polarity as the polarity of the second voltage.

2. The nonvolatile storage device according to claim 1, wherein the third voltage has a larger pulse width than a pulse width of the first voltage.

3. The nonvolatile storage device according to claim 1, wherein the first voltage has a larger pulse width than a pulse width of the third voltage.

4. The nonvolatile storage device according to claim 1, wherein after the pulse of the first voltage is applied to said variable resistance element in the writing operation, said write circuit repeats the additional writing N times, where N is an integer greater than or equal to 2.

5. The nonvolatile storage device according to claim 4, wherein in the repetition of N times, said write circuit applies the pulse of the third voltage N times so that the absolute value of the third voltage decreases as the number of repetitions increases.

6. The nonvolatile storage device according to claim 1, wherein said read circuit applies a read voltage to said variable resistance element, and obtains the resistance value data by counting a decay time from when the application of the read voltage is stopped to when a sense voltage falls below a predetermined reference voltage value.

7. The nonvolatile storage device according to claim 6, wherein the sense voltage is set to a value based on a resistance value of said variable resistance element, by the read voltage being applied to said variable resistance element, and starts decaying from the set value by the application of the read voltage being stopped.

8. The nonvolatile storage device according to claim 6, wherein said read circuit includes a counter which starts counting up from a point in time when the application of the read voltage is stopped, and the decay time is detected as a counter value when the sense voltage falls below the reference voltage value.

9. The nonvolatile storage device according to claim 6, wherein said write circuit controls writing based on the resistance value data obtained by said read circuit.

10. The nonvolatile storage device according to claim 1, further comprising
a control circuit which controls said write circuit and said read circuit,
wherein said read circuit performs a read process after said write circuit performs, when said variable resistance element is caused to change from the first resistance state to the second resistance state, at least (i) a first write process of applying the pulse of the first voltage to said variable resistance element and (ii) a second write process of applying the pulse of the third voltage and the pulse of the first voltage to said variable resistance element in this order, and
said control circuit controls said write circuit and said read circuit so that the second write process and the read process are repeated until a resistance value of said variable resistance element reaches a predetermined resistance value.

11. The nonvolatile storage device according to claim 10, wherein after said write circuit first performs the second write process and said read circuit then performs the read process after a lapse of a predetermined time, said control circuit controls said write circuit and said read circuit so that the second write process and the read process are repeated until said variable resistance element has the predetermined resistance value.

12. The nonvolatile storage device according to claim 1, wherein said variable resistance element and a selection element constitute a memory cell, said selection element being connected in series to said variable resistance element and switching between a conduction state and a nonconduction sate of said variable resistance element,
said nonvolatile storage device further comprising:
a memory cell array which is a set of memory cells including said memory cell;
a selection circuit which selects at least one of said memory cells from said memory cell array;
a read circuit which reads data from said memory cell selected by said selection circuit;
a write data buffer which holds data items to be written into M memory cells in said memory cell array, the M memory cells corresponding to the data items, where M is an integer equal to or greater than 2;
a read data buffer which holds data items read from M memory cells in said memory cell array;
a comparison circuit which compares the data items of said corresponding M memory cells in said write data buffer with the data items of said M memory cells in said read data buffer, and judges whether or not the data items match each other; and
a control circuit which performs (i) control of said selection circuit and said write circuit so that the data items held in said write data buffer are written into said corresponding M memory cells in said memory cell array, (ii) control of said selection circuit and said read circuit so that the data items are read from said M memory cells in said memory cell array and held in said read data buffer, and (iii) control as to whether or not to rewrite again the data items held in said write data buffer into said corresponding M memory cells, based on a result of the comparison by said comparison circuit.

13. The nonvolatile storage device according to claim 12, wherein each of said write data buffer and said read data buffer includes a plurality of data buffer areas, said data buffer areas of said write data buffer corresponding to said data buffer areas of said read data buffer, and
said control circuit sequentially performs, for said data buffer areas of said write data buffer and said data buffer areas of said read data buffer, (i) the control of said selection circuit and said write circuit so that the data items held in said write data buffer are written into said corresponding M memory cells in said memory cell array, (ii) the control of said selection circuit and said read circuit so that the data items are read from said M memory cells in said memory cell array and held in said read data buffer, and (iii) the control as to whether or not to rewrite again the data items held in said write data buffer into said corresponding M memory cells, based on a result of the comparison by said comparison circuit.

* * * * *